(12) United States Patent
Chang et al.

(10) Patent No.: US 8,216,902 B2
(45) Date of Patent: Jul. 10, 2012

(54) NANOMESH SRAM CELL

(75) Inventors: Josephine Chang, Yorktown Heights, NY (US); Paul Chang, Hopewell Junction, NY (US); Michael A. Guillorn, Yorktown Heights, NY (US); Jeffrey Sleight, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 321 days.

(21) Appl. No.: 12/536,741

(22) Filed: Aug. 6, 2009

(65) Prior Publication Data

US 2011/0031473 A1 Feb. 10, 2011

(51) Int. Cl.
*H01L 21/8234* (2006.01)

(52) U.S. Cl. .............. 438/275; 257/E21.645; 977/938

(58) Field of Classification Search .............. 438/275; 257/E21.645
See application file for complete search history.

(56) References Cited

U.S. PATENT DOCUMENTS

| | | | |
|---|---|---|---|
| 5,965,914 A | 10/1999 | Miyamoto | |
| 7,205,589 B2 | 4/2007 | Madurawe | |
| 7,288,961 B2 | 10/2007 | Bertin | |
| 7,307,872 B2 | 12/2007 | Kang et al. | |
| 7,445,980 B2 | 11/2008 | Datta et al. | |
| 7,462,890 B1 | 12/2008 | Tombler, Jr. et al. | |
| 7,893,492 B2 * | 2/2011 | Bedell et al. | 257/346 |
| 2006/0202271 A1 | 9/2006 | Kato | |
| 2006/0220134 A1 | 10/2006 | Huo et al. | |
| 2007/0029586 A1 | 2/2007 | Orlowski | |
| 2008/0017934 A1 | 1/2008 | Kim et al. | |
| 2008/0210981 A1 | 9/2008 | Chang et al. | |
| 2010/0295021 A1* | 11/2010 | Chang et al. | 257/24 |

FOREIGN PATENT DOCUMENTS

EP 0553774 A1 8/1993

* cited by examiner

*Primary Examiner* — Seahvosh Nikmanesh
(74) *Attorney, Agent, or Firm* — Vazken Alexanian; Michael J. Chang, LLC

(57) ABSTRACT

Nanowire-based devices are provided. In one aspect, a SRAM cell includes at least one pair of pass gates and at least one pair of inverters formed adjacent to one another on a wafer. Each pass gate includes one or more device layers each having a source region, a drain region and a plurality of nanowire channels connecting the source region and the drain region and a gate common to each of the pass gate device layers surrounding the nanowire channels. Each inverter includes a plurality of device layers each having a source region, a drain region and a plurality of nanowire channels connecting the source region and the drain region and a gate common to each of the inverter device layers surrounding the nanowire channels.

5 Claims, 36 Drawing Sheets

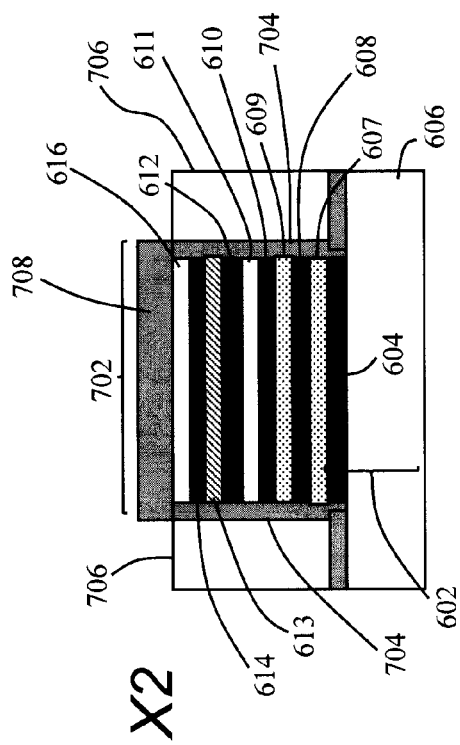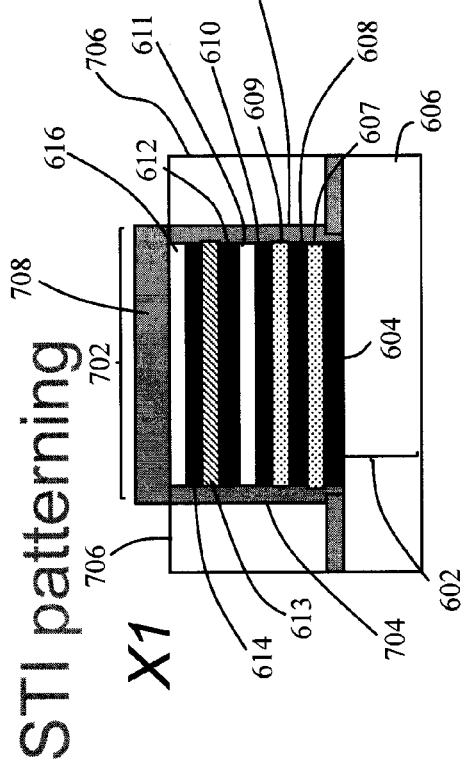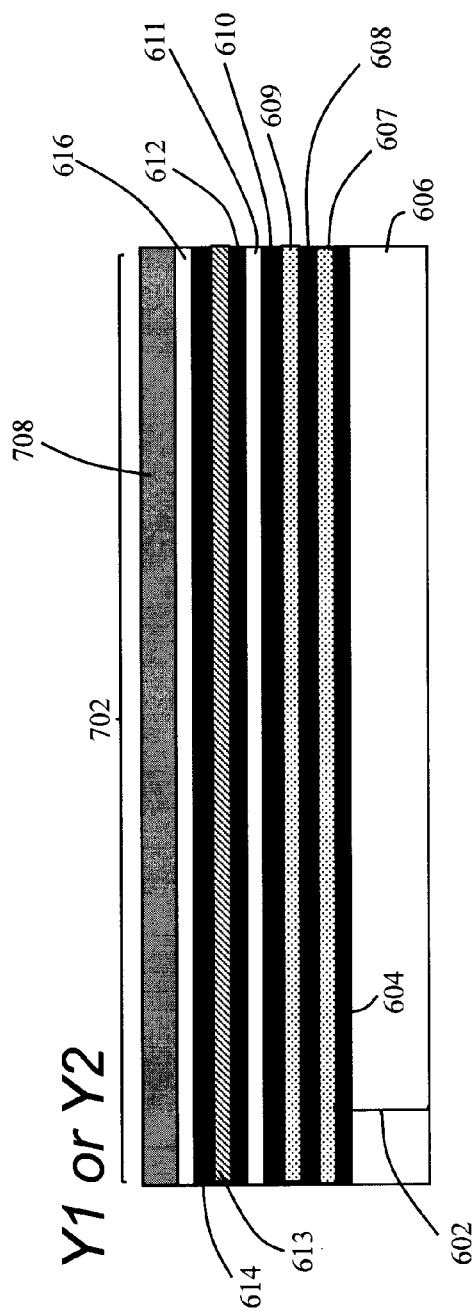
FIG. 7A
FIG. 7B
FIG. 7C

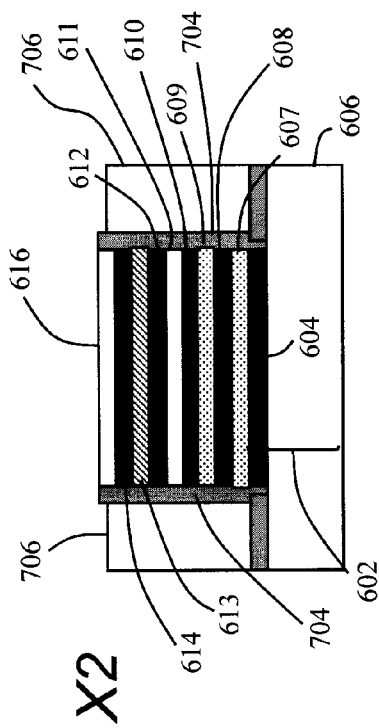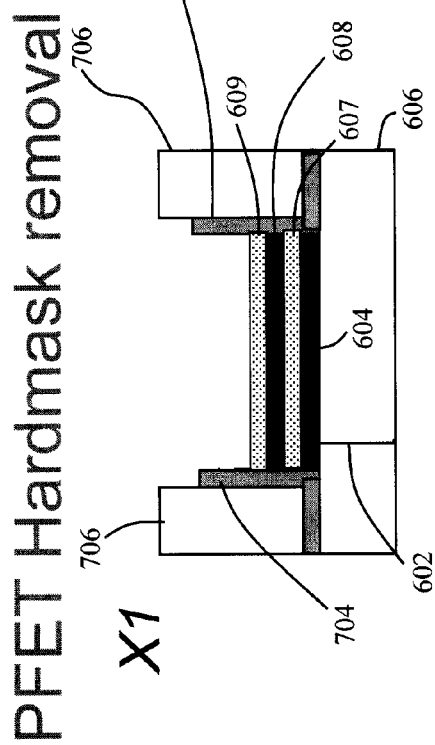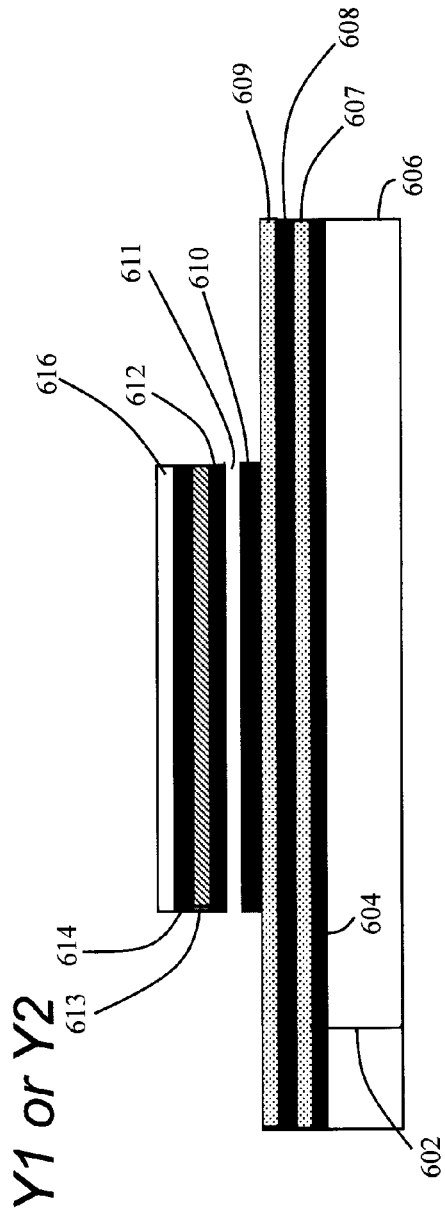
FIG. 9A
FIG. 9B
FIG. 9C

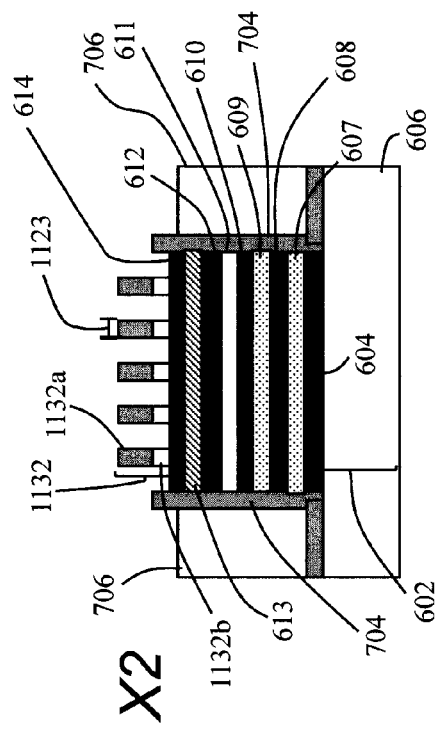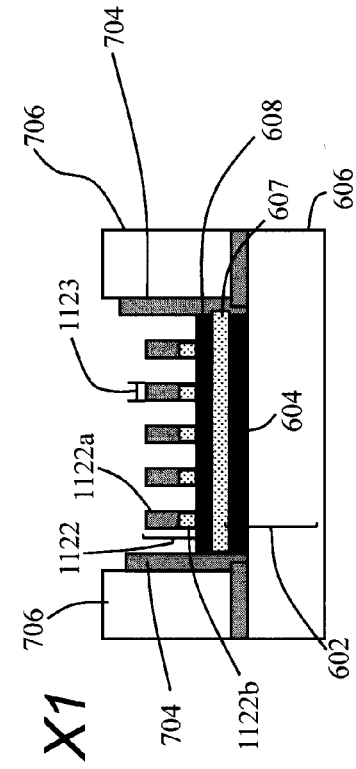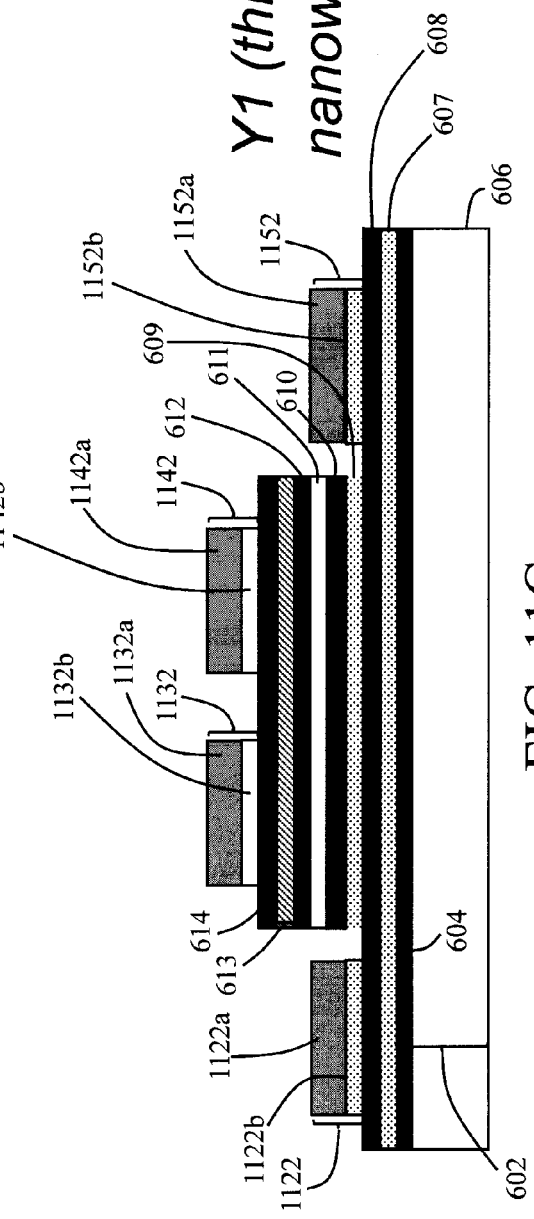
FIG. 11A
FIG. 11B
FIG. 11C

Fin hardmask patterning

Y2 (not through a nanowire portion)

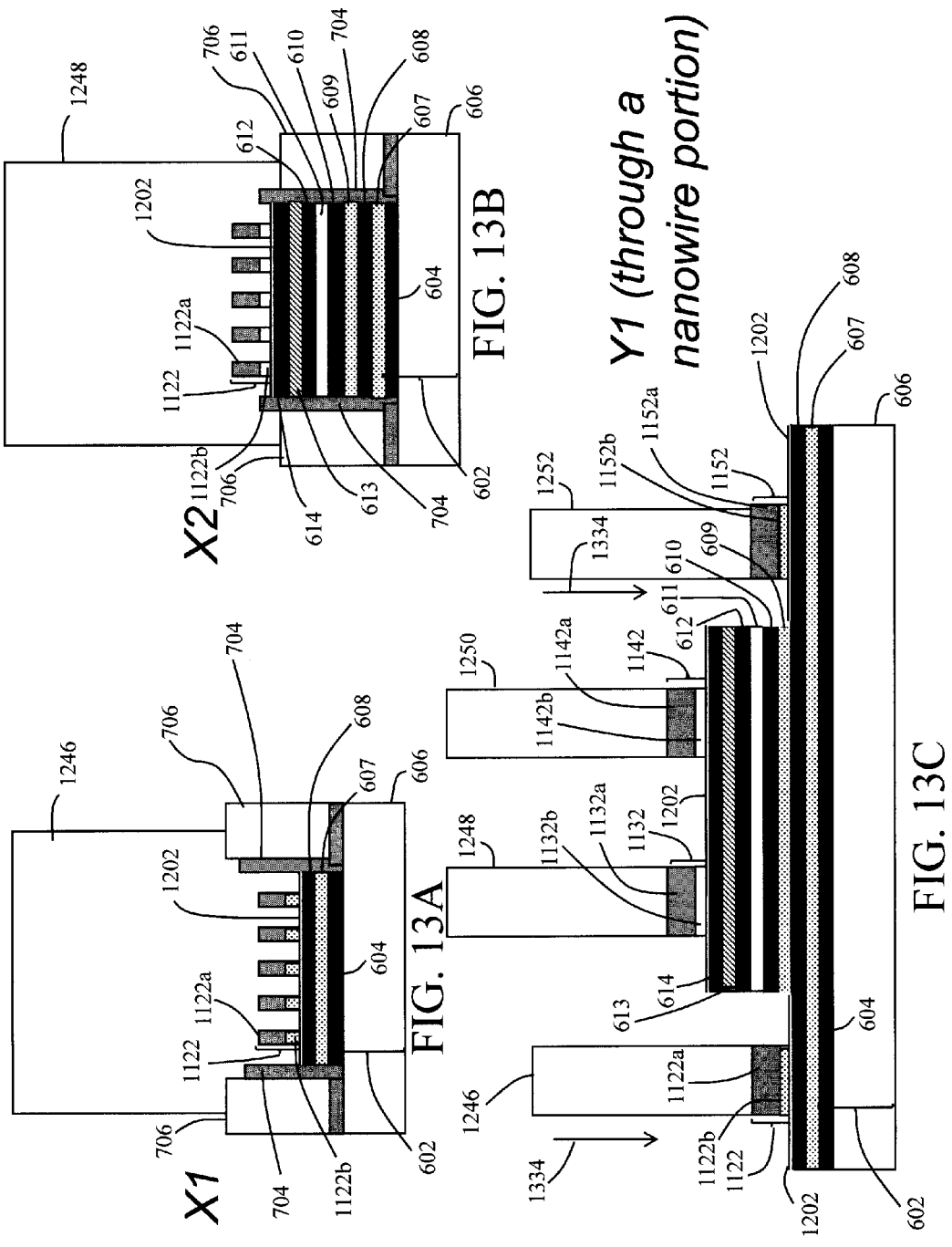

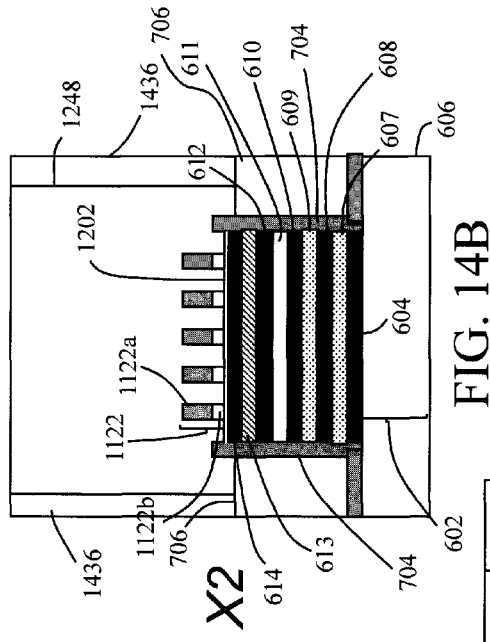
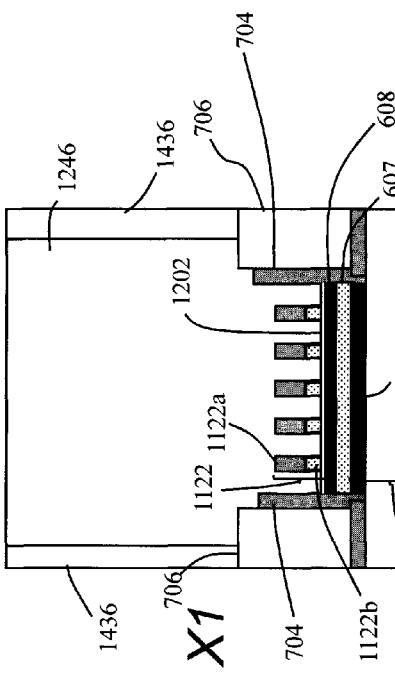
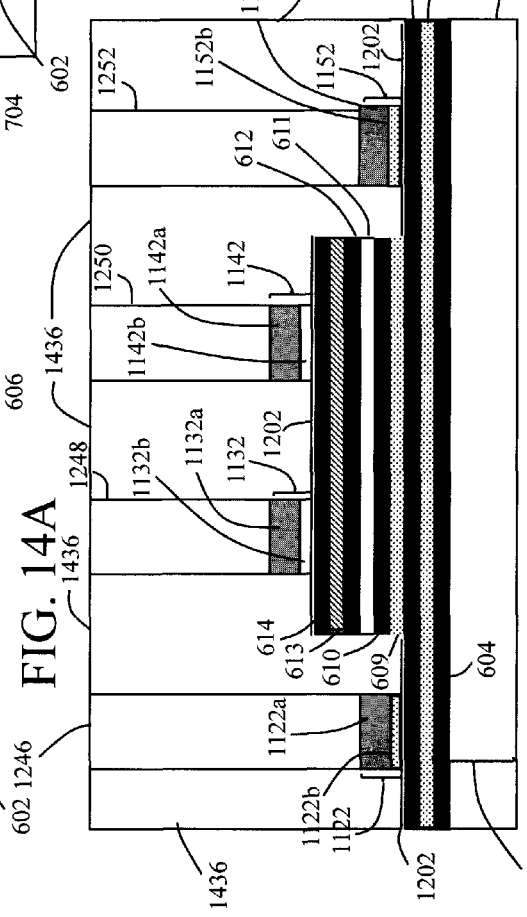
FIG. 14A
FIG. 14B
FIG. 14C
Y1 (through a nanowire portion)

Oxide Fill + CMP

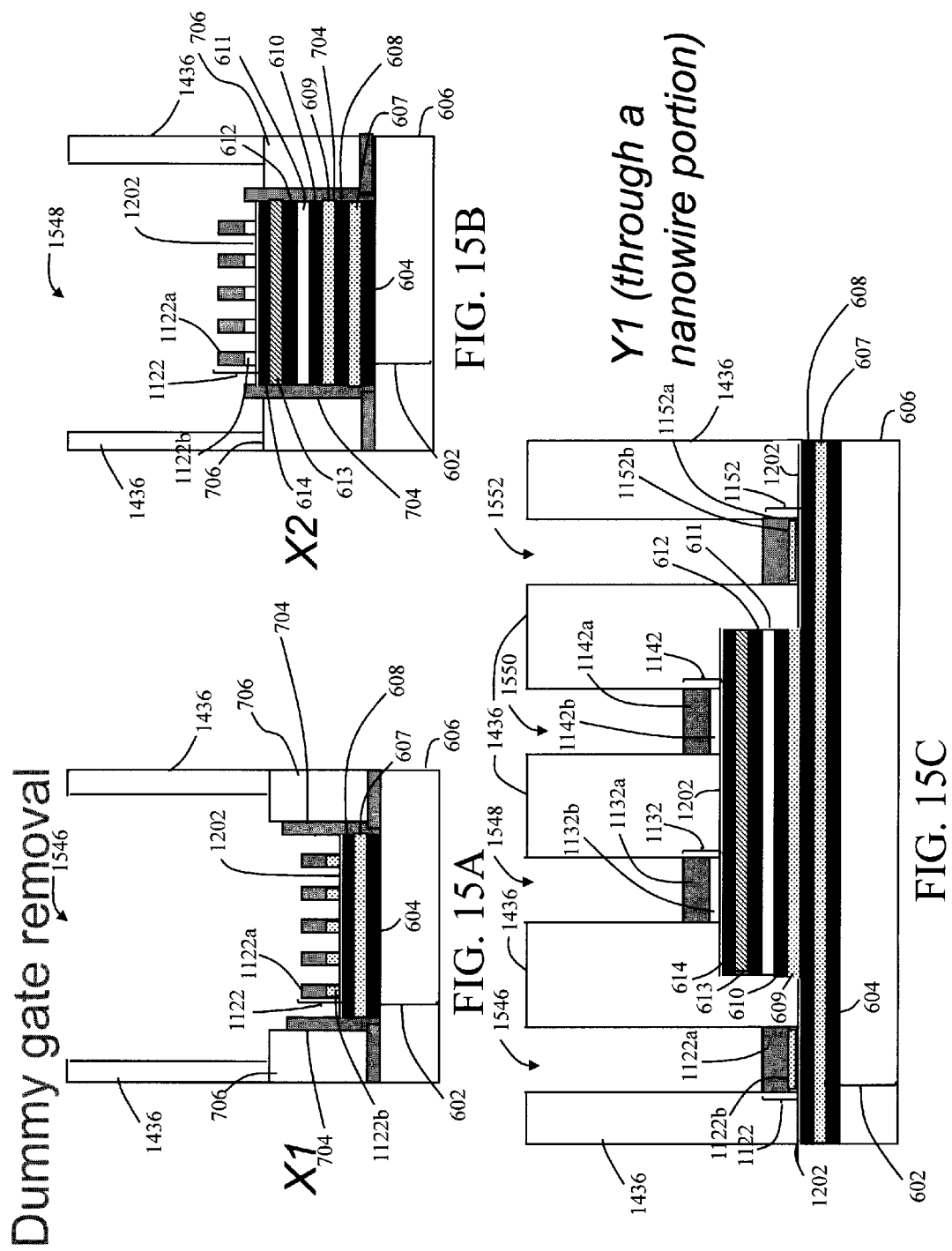

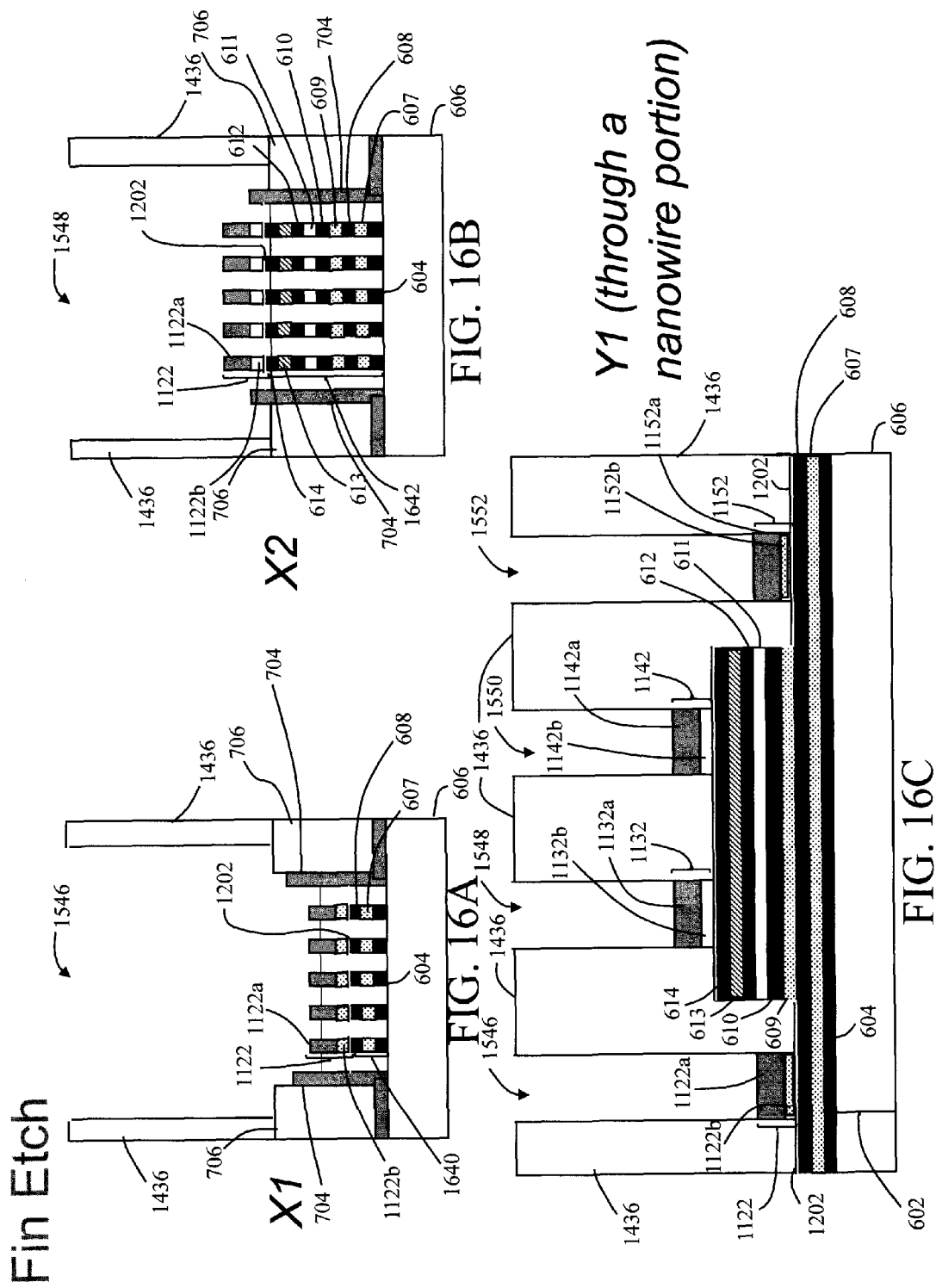

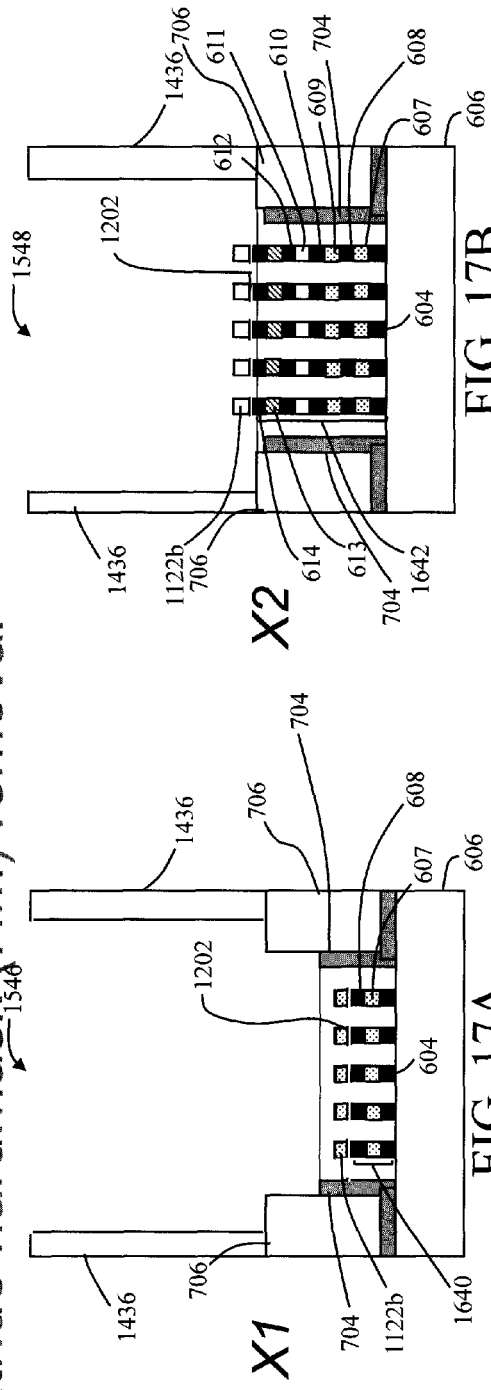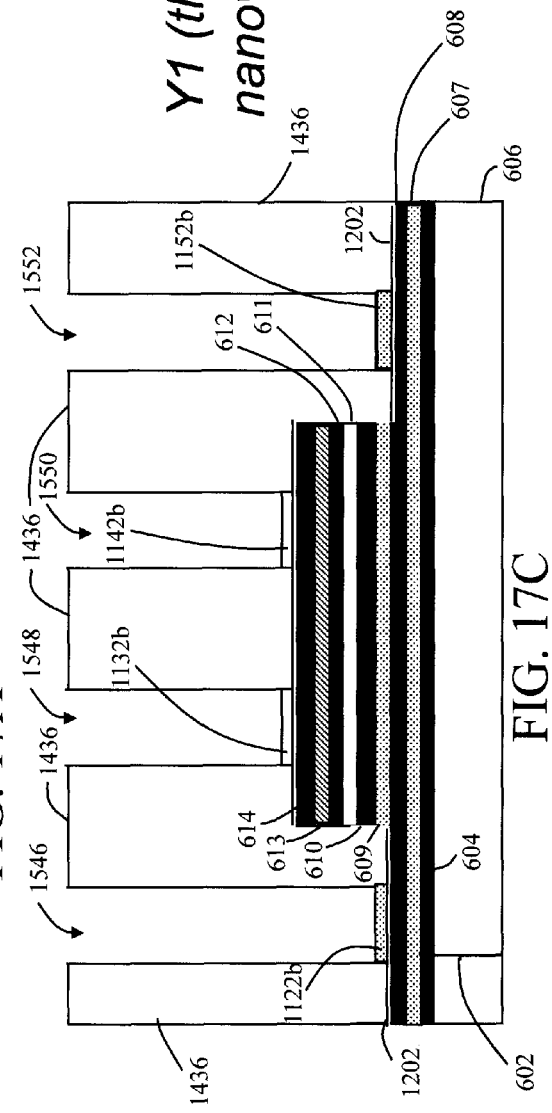

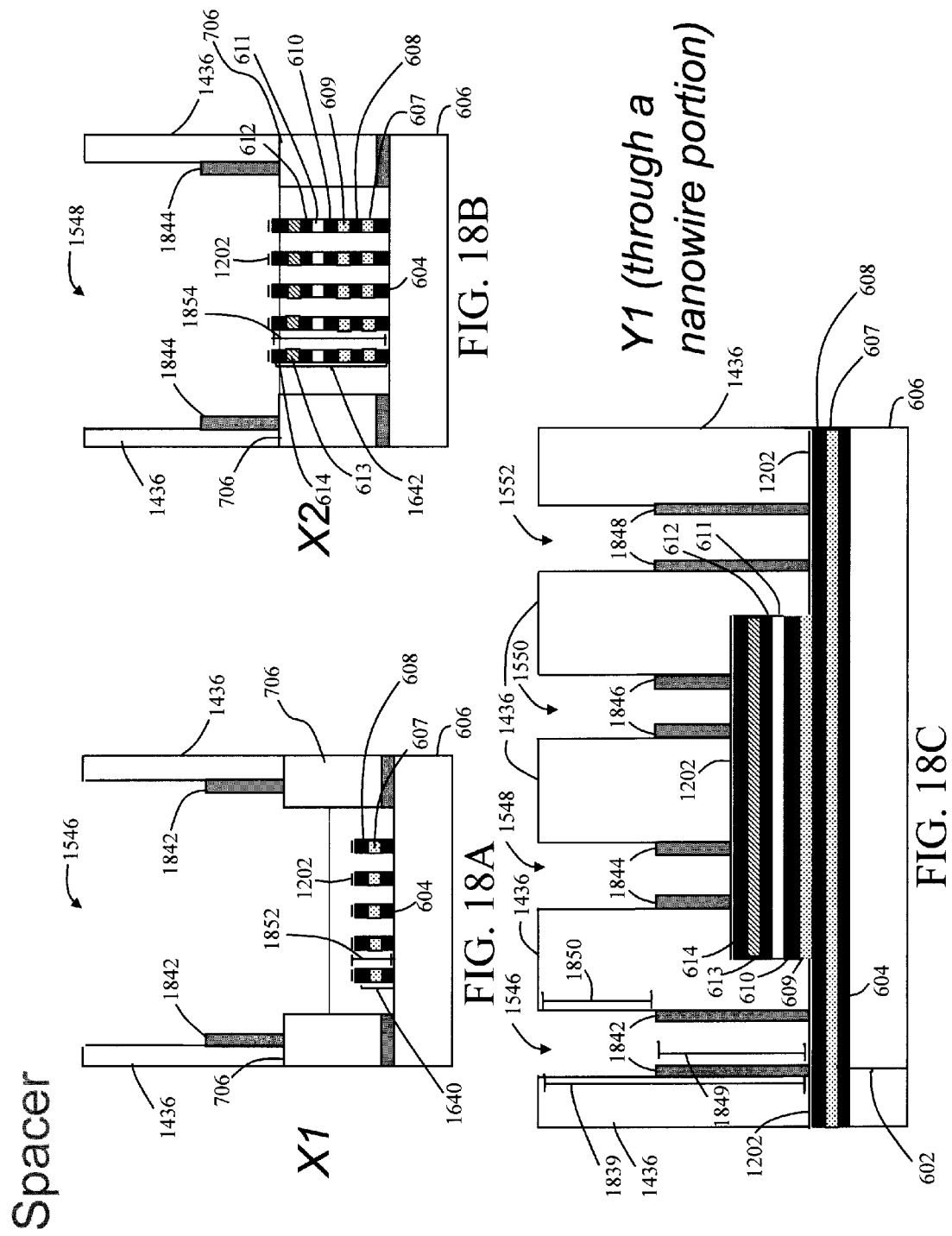

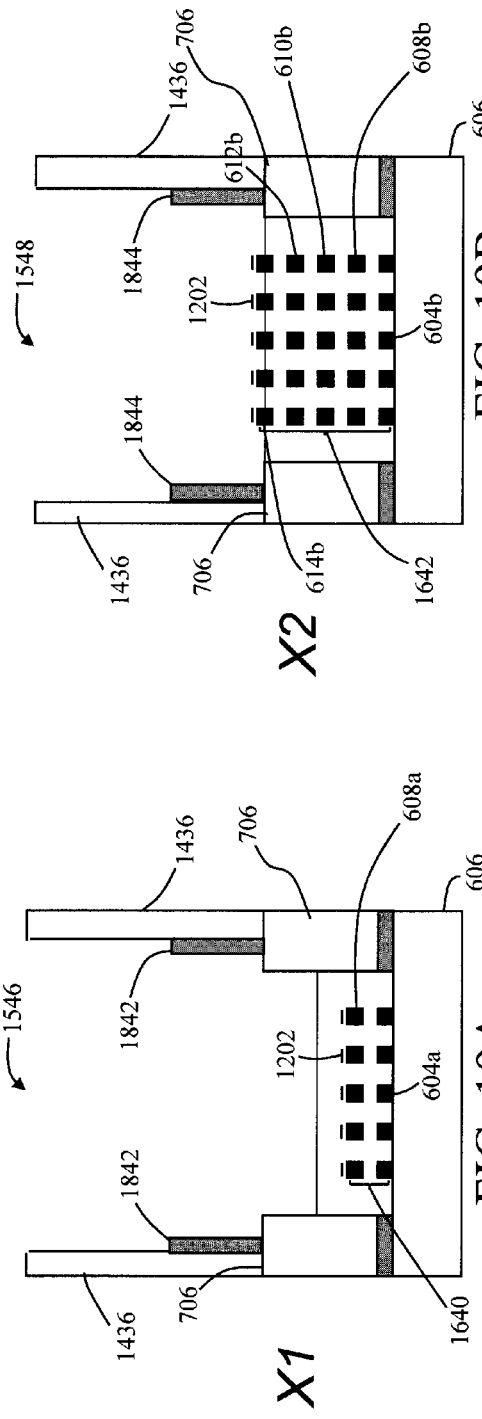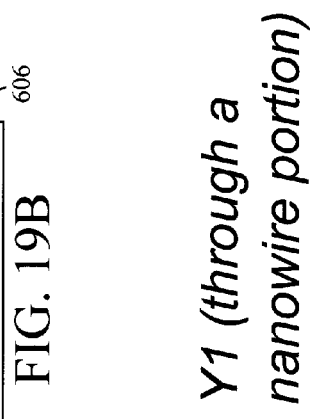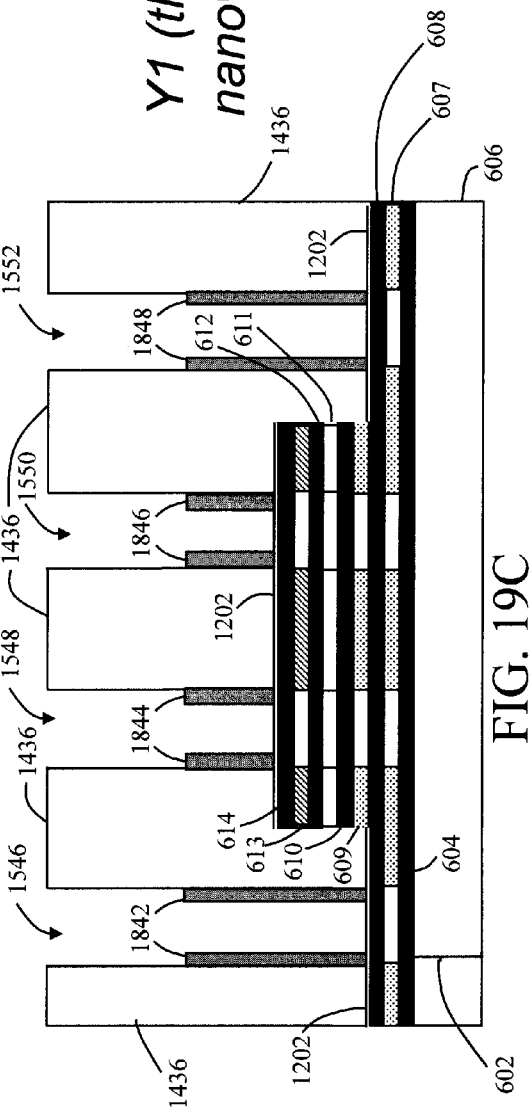

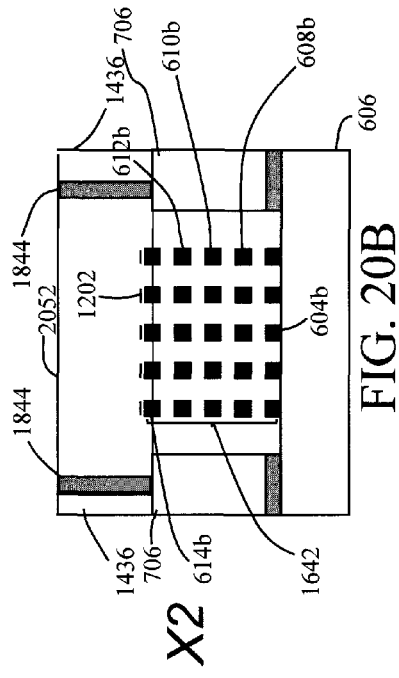
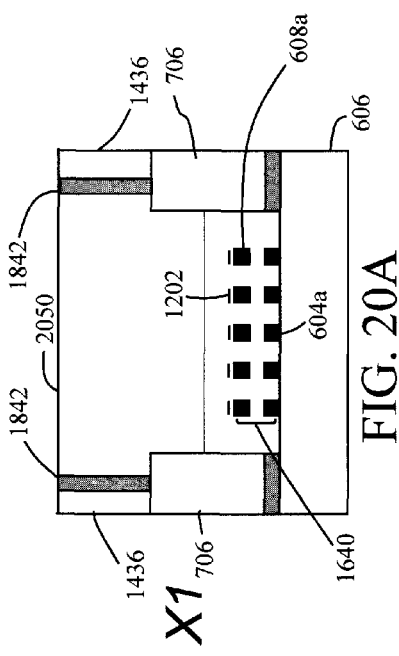
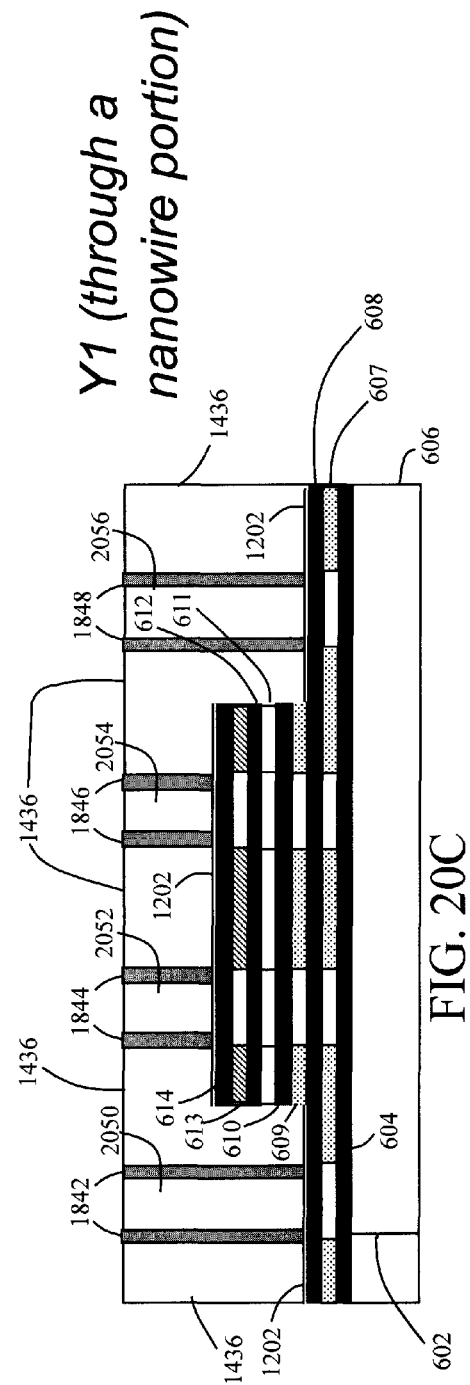
Gate stack deposition + CMP
FIG. 20A
FIG. 20B
FIG. 20C Fill Removal Y1 (through a nanowire portion)

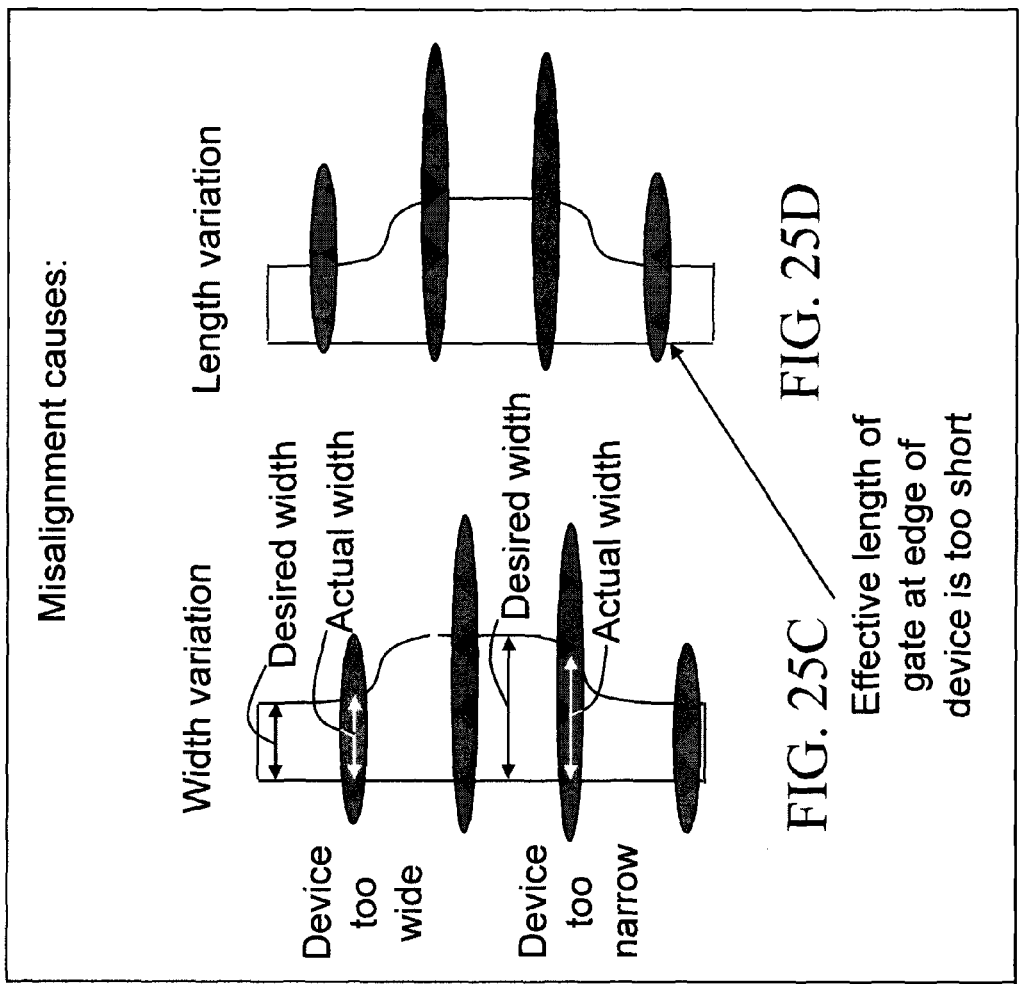
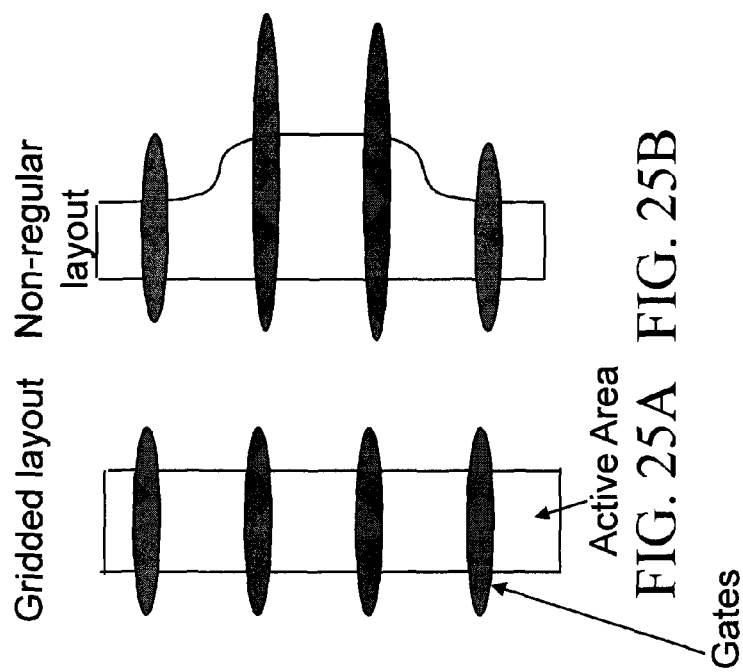
FIG. 25A  FIG. 25B  FIG. 25C  FIG. 25D

NANOMESH SRAM CELL

CROSS-REFERENCE TO RELATED APPLICATIONS

This application is related to the commonly owned U.S. application Ser. No. 12/371,943, entitled "Nanowire Mesh Device and Method of Fabricating Same," filed on Feb. 17, 2009, the contents of which are incorporated herein by reference.

BACKGROUND OF THE INVENTION

1. Field of the Invention

The present invention relates to nanowire-based devices, and more particularly, to nanowire-based static random access memory (SRAM) devices.

2. Description of the Related Art

In a static random access memory (SRAM) cell a combination of field-effect transistors (FETs) are used to store each bit. For example, in a six transistor (6T) SRAM design each cell contains six field-effect transistors (FETs). Other configurations vary the number of transistors, such as eight transistor (8T) and ten transistor (10T) SRAM.

In typical SRAM design layouts, there are many non-linear edges involved in the active area and gate definition masks. In conventional complementary metal-oxide semiconductor (CMOS)-based fabrication processes, the SRAM design layout is adjusted to obtain the smallest cell size possible so as to increase layout density, and hence great care is taken in the mask generation. However, since features involved in the active area definition and gate definition are not all the same size and/or orientation, these features are prone to lithography, etching and other process variations. Variations can adversely affect the performance of the completed device.

Therefore, SRAM cell designs that increase the layout density while effectively minimizing process variations would be desirable.

SUMMARY OF THE INVENTION

The present invention provides nanowire-based devices. In one aspect of the invention, a static random access memory (SRAM) cell is provided. The SRAM cell includes at least one pair of pass gates and at least one pair of inverters formed adjacent to one another on a wafer. Each pass gate includes one or more device layers each device layer having a source region, a drain region and a plurality of nanowire channels connecting the source region and the drain region, wherein the source and drain regions of one or more of the pass gate device layers are doped with at least one n-type dopant, and a gate common to each of the pass gate device layers surrounding the nanowire channels. Each inverter includes a plurality of device layers each device layer having a source region, a drain region and a plurality of nanowire channels connecting the source region and the drain region, wherein the source and drain regions of one or more of the inverter device layers are doped with at least one n-type dopant and the source and drain regions of one or more other of the inverter device layers are doped with at least one p-type dopant, and a gate common to each of the inverter device layers surrounding the nanowire channels. The drain regions of the inverter device layers doped with the n-type dopant and the p-type dopant can be shorted to each other while the source regions of the inverter device layers doped with the n-type dopant can remain electrically isolated from the source regions of the inverter device layers doped with the p-type dopant.

In another aspect of the invention, a SRAM array is provided. The SRAM array includes a plurality of SRAM cells formed on a wafer. Each cell includes at least one pair of pass gates and at least one pair of inverters formed adjacent to one another on the wafer. Each pass gate includes one or more device layers each device layer having a source region, a drain region and a plurality of nanowire channels connecting the source region and the drain region, wherein the source and drain regions of one or more of the pass gate device layers are doped with at least one n-type dopant, and a gate common to each of the pass gate device layers surrounding the nanowire channels. Each inverter includes a plurality of device layers each device layer having a source region, a drain region and a plurality of nanowire channels connecting the source region and the drain region, wherein the source and drain regions of one or more of the inverter device layers are doped with at least one n-type dopant and the source and drain regions of one or more other of the inverter device layers are doped with at least one p-type dopant, and a gate common to each of the inverter device layers surrounding the nanowire channels.

In yet another aspect of the invention, a method for fabricating a SRAM cell is provided. The method includes the following steps. At least one pair of pass gates is formed by forming, for each pass gate, one or more device layers on a wafer, each pass gate device layer including a source region, a drain region and a plurality of nanowire channels connecting the source region and the drain region, and forming a gate common to each of the pass gate device layers surrounding the nanowire channels. At least one pair of inverters is formed by forming, for each inverter, a plurality of device layers adjacent to the pass gate device layers on the wafer, each inverter device layer including a source region, a drain region and a plurality of nanowire channels connecting the source region and the drain region, and forming a gate common to each of the inverter device layers surrounding the nanowire channels. At least one n-type dopant is introduced into the source and drain regions of one or more of the pass gate device layers. At least one n-type dopant is introduced into the source and drain regions of one or more of the inverter device layers. At least one p-type dopant is introduced into the source and drain regions of one or more other of the inverter device layers.

A more complete understanding of the present invention, as well as further features and advantages of the present invention, will be obtained by reference to the following detailed description and drawings.

BRIEF DESCRIPTION OF THE DRAWINGS

FIGS. 7A-C are two-dimensional cross-sectional diagrams illustrating the definition of an active area by shallow trench isolation (STI) patterning according to an embodiment of the present invention;

FIGS. 9A-C are two-dimensional cross-sectional diagrams illustrating hardmask removal from areas where inverters will be formed according to an embodiment of the present invention;

FIGS. 11A-D are two-dimensional cross-sectional diagrams illustrating the dual hardmask structure patterned into a plurality of individual nanowire hardmasks according to an embodiment of the present invention;

FIGS. 13A-D are two-dimensional cross-sectional diagrams illustrating the nanowire hardmasks trimmed around the dummy gate according to an embodiment of the present invention;

FIGS. 14A-D are two-dimensional cross-sectional diagrams illustrating a filler layer deposited around the dummy gate and planarized according to an embodiment of the present invention;

FIGS. 15A-D are two-dimensional cross-sectional diagrams illustrating the dummy gate having been removed resulting in trenches being formed in the filler layer according to an embodiment of the present invention;

FIGS. 16A-D are cross-sectional diagrams illustrating nanowire fin stacks according to an embodiment of the present invention;

FIGS. 17A-D are two-dimensional cross-sectional diagrams illustrating any exposed nitride portion of the nanowire hardmasks removed according to an embodiment of the present invention;

FIGS. 18A-D are cross-sectional diagrams illustrating spacers formed in the trench and cleared from sidewalls of the fin stacks according to an embodiment of the present invention;

FIGS. 19A-D are two-dimensional cross-sectional diagrams illustrating sacrificial material having been removed from the nanowire fin stacks according to an embodiment of the present invention;

FIGS. 20A-D are two-dimensional cross-sectional diagrams illustrating replacement gates formed in the trenches according to an embodiment of the present invention;

FIGS. 25A-D are top-down schematic diagrams illustrating the benefits of using regular active area shapes according to an embodiment of the present invention.

DETAILED DESCRIPTION OF PREFERRED EMBODIMENTS

Figure 1:
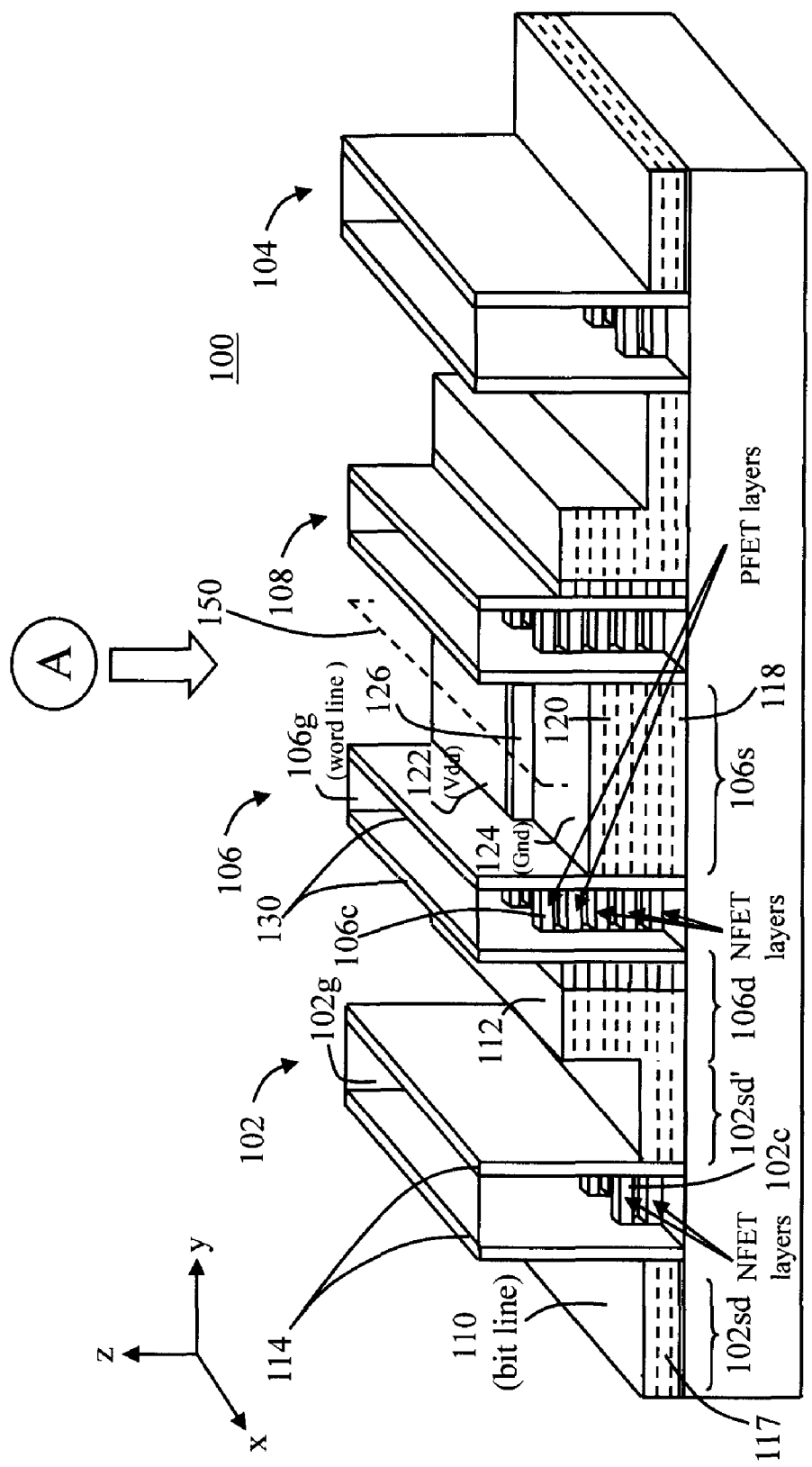
FIG. 1 is a three-dimensional cross-sectional diagram illustrating an exemplary static random access memory (SRAM) cell according to an embodiment of the present invention.

FIG. 1 is a three-dimensional cross-sectional diagram illustrating exemplary static random access memory (SRAM) cell 100. The configuration shown is a 6T SRAM cell containing six nanowire mesh-based field-effect transistors (FETs), configured as a pair of pass gates and a pair of inverters, e.g., with the pair of inverters located in between and separating the pair of pass gates. The depiction of a six transistor (6T) SRAM cell is merely to provide an example by which to illustrate the present teachings. Namely, other cell designs, such as 8T and 10T configurations may be similarly configured and would be within the scope of the present teachings.

The two pass gates, i.e., pass gates 102 and 104, each comprise one nanowire mesh-based transistor (an n-channel FET (NFET) transistor), and the two inverters, i.e., inverters 106 and 108, each comprise two nanowire mesh-based transistors (an NFET/p-channel FET (PFET) pair of transistors). According to the exemplary embodiment depicted in FIG. 1, both pass gates are configured to be the same as one another and both inverters are configured to be the same as one another (i.e., the structure to the left of line 150 is a mirror image of the structure to the right of line 150). Thus, for ease of depiction, only the structures in one of the pass gates and one of the inverters are labeled. However, it may be desirable to employ asymmetric pass gates and/or inverters.

Each pass gate is made up of a number of device layers 117 oriented vertically in a stack, each device layer having a first source/drain region 102sd and a second source/drain region 102sd', stacked layers of nanowire channels 102c connecting source/drain regions 102sd and 102sd' and a gate 102g surrounding the nanowire channels. One of source/drain regions 102sd and 102sd' serves as a bit line node, and the other of source/drain regions 102sd and 102sd' (in conjunction with the drain region of the adjacent inverter) serves as an internal storage node (see below). The gate serves as a word line. The multiple layers of nanowire channels are also referred to herein as a nanowire "mesh." Through selective doping one or more of the pass gate device layers are configured as NFETs. The NFET layer(s) share a common gate 102g.

Contacts 110 and 112 are provided to source/drain region 102sd (e.g., a bit line contact) and source/drain region 102sd' (e.g., an internal storage node), respectively. As will be described in detail below, contacts 110 and 112 may be formed from a silicide that vertically merges all layers in the source/drain regions. Contact 112 is common to, and merges, the drain regions of the adjacent inverter device layers as well (see below). Thus, for illustrative purposes, dotted lines are used for the device layers in the source and drain regions to depict individual layers merged into a common contact. Spacers 114 (e.g., nitride spacers) separate gate 102g from source/drain regions 102sd and 102sd'. An exemplary methodology for fabricating pass gates 102 and 104 is provided below. Advantageously, according to the present teachings, pass gates 102 and 104 can be fabricated along with inverters 106 and 108 in the same process which reduces an overall cost of production.

Each inverter is made up of a number of device layers 118 oriented vertically in a stack, each device layer having a source region 106s, a drain region 106d, a plurality of nanowire channels 106c (a nanowire mesh) connecting the source region and the drain region and a gate 106g surrounding the nanowire channels. Through selective doping one or more of the device layers are configured as NFETs and one or more other of the device layers are configured as PFETs. The NFETs and PFETs are separated by an electrically insulating layer 120. According to an exemplary embodiment, the device layer(s) above the electrically insulating layer are configured to be PFET layer(s) and the device layer(s) below the electrically insulating layer are configured to be NFET layer(s) (see device layers labeled "PFET" and "NFET," respectively). The PFET layer(s) and the NFET layer(s) share a common gate 106g. The drain regions 106d of the PFET layer(s) and the NFET layer(s) are shorted to each other and to the source/drain regions 102sd' of the pass gates through a common contact region. Further, according to the exemplary embodiment shown in FIG. 1, inverters 106 and 108 share common source region 106s. The source regions of the PFET device layers serve as power ($V_{dd}$) nodes to the inverters and the source regions of the NFET device layers serve as ground (Gnd) nodes to the inverters. The gates serve as inputs ($V_{in}$) to the inverters, and thus word lines for the SRAM cell. The drain regions serve as inverter output nodes ($V_{out}$) and thus internal storage nodes for the SRAM cell.

The PFET layer(s) form one transistor of the inverter and the NFET layer(s) form a second transistor of the inverter. Thus, the SRAM cell in this example contains a total of six transistors, one associated with each of the pass gates and two associated with each of the inverters.

Contact 122 is provided to the source region(s) of the PFET device layer(s) and contact 124 is provided to the source region(s) of the NFET device layer(s). Spacer 126 (e.g., a nitride spacer) separates the PFET and NFET source regions from one another. Contact 112 is provided to (connecting) the drain regions of each of the PFET and NFET device layers. Namely, contact 112 shorts the drain regions across these device layers. Further, as highlighted above, contact 112 is common to the source/drain region of the adjacent pass gate. Spacers 130 (e.g., nitride spacers) separate gate 106g from source regions 106s and drain regions 106d. An exemplary methodology for fabricating inverters 106 and 108 is provided below. Nanowire mesh inverters and techniques for fabrication thereof are also described, for example, in U.S. patent application Ser. No. 12/470,128, entitled "Single Gate Inverter Nanowire Mesh", filed on May 21, 2009, the contents of which are incorporated by reference herein.

For ease and clarity of description, the merged portions of the pass gate transistor source/drain regions and associated contacts that serve as the bit line contacts of the SRAM cell, such as source/drain region 102sd merged into contact 110, may also be referred to herein as "bit line contact regions." Likewise, the merged portions of the pass gate transistor source/drain regions and common adjacent inverter drain regions and associated contacts that serve as the internal storage node contacts of the SRAM cell, such as source/drain region 102sd'/drain region 106d merged into contact 112, may also be referred to herein as internal storage node contact regions. The source region(s) of the inverter PFET device layer(s) and associated contact that serve as a power node of the SRAM cell may also be referred to herein as a "power node contact region," and the source region(s) of the inverter NFET device layer(s) and associated contact that serve as a ground node of the SRAM cell may also be referred to herein as a "ground node contact region."

Electrically conductive paths will be present (not shown) connecting the various contacts of the devices in SRAM cell 100. Exemplary electrically conductive path (i.e., metal lines/contact configurations) will be provided below. As will also be described in detail below, the present SRAM cell designs have a "gridded" configuration (i.e., contain regular patterns with, for example, no corners, and the same spacing from one feature to the next, same line width, etc). A gridded design enables more regular lithography which lowers variations, both at the patterning stages and during subsequent processing (which can echo and/or amplify any initial lithography variations). Further, as is apparent from the exemplary layout shown in FIG. 1, the present SRAM cell designs maximize layout density through, e.g., vertical stacking of the device layers, with six transistors occupying only four gate lines of layout area.

An exemplary SRAM array layout that incorporates the SRAM cell configuration of FIG. 1 will now be presented. For ease of depiction and description, top-down views (for example from vantage point A (see FIG. 1)) highlighting different layers of the array will be shown separately in FIGS. 2-5. FIGS. 2-5 illustrate one possible way the nanowire mesh-based devices shown in FIG. 1 can be arranged to form an SRAM array. It is to be understood that this particular configuration shown is merely exemplary and various other SRAM array designs are possible through the present teachings. What FIGS. 2-5 are meant to highlight is that a gridded configuration with regular patterns can be easily and effectively achieved with the present techniques. As highlighted above, a gridded design enables more regular lithography which minimizes process variations.

Figure 2:
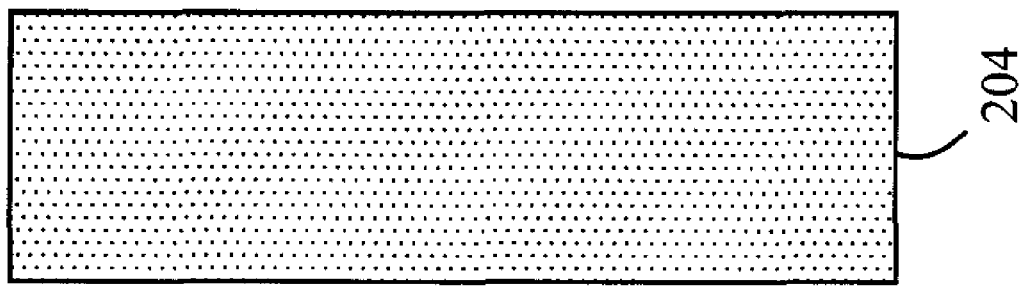
FIG. 2 is a top-down diagram illustrating two active areas of an SRAM array that contain source and drain regions and gates of the array according to an embodiment of the present invention.
Figure 2:
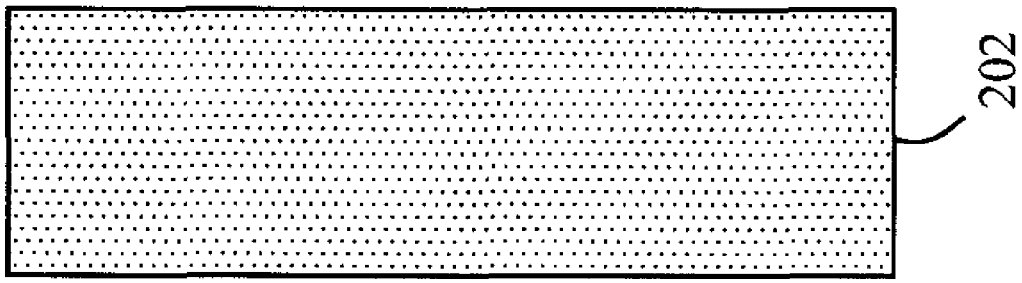

FIG. 2 is a top-down diagram, for example from vantage point A (see FIG. 1), illustrating two active areas 202 and 204. Each active area is associated with one four gate 6T SRAM cell. Thus, the SRAM array depicted includes two 6T SRAM cells (with active areas 202 and 204 corresponding to Cell 1 and Cell 2, respectively), essentially representing two of the four gate 6T SRAM cells shown in FIG. 1 adjacent to one another on the same wafer. The active area contains source and drain regions and gates of the array. The active areas of the cells can be isolated on the wafer using shallow trench isolation (STI). Each active area will contain the source and drain regions and nanowire channels of each FET associated therewith.

Figure 3:
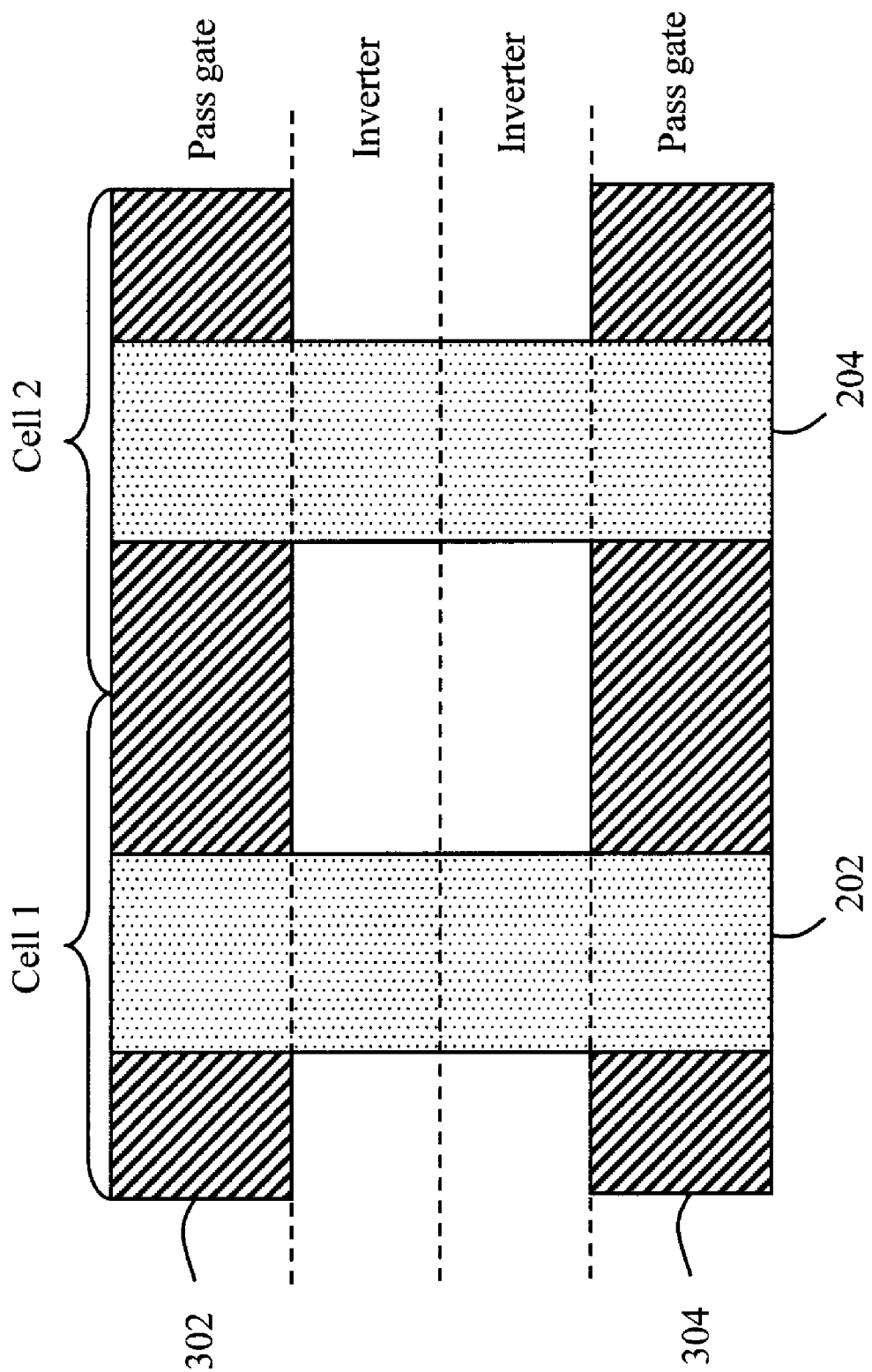
FIG. 3 is a top-down diagram illustrating the SRAM array below the gates according to an embodiment of the present invention.

FIG. 3 is a top-down diagram, for example from vantage point A (see FIG. 1), illustrating the SRAM array below the gates, i.e., what would be visible prior to gate formation. As highlighted in FIG. 1, one exemplary configuration has two pass gates separated by two inverters. This exemplary configuration is shown in FIG. 3. Blocks 302 and 304 illustrate a recess of one or more layers of the pass gates (relative to the inverters). As will be described in detail below, the inverters and pass gates have a common starting structure, i.e., with an alternating series of silicon (Si) and sacrificial layers on a silicon-on-insulator (SOI) wafer as a stack. However, to fabricate the pass gates some of the layers of the stack, i.e., the top layers, are removed. This is what is shown in FIG. 3. These layers that are removed from the pass gates (blocks 302 and 304) are what constitute the PFET device layers in the inverter which are not needed in the (NFET) pass gates. Procedures for removing these layers are described below.

Figure 4:
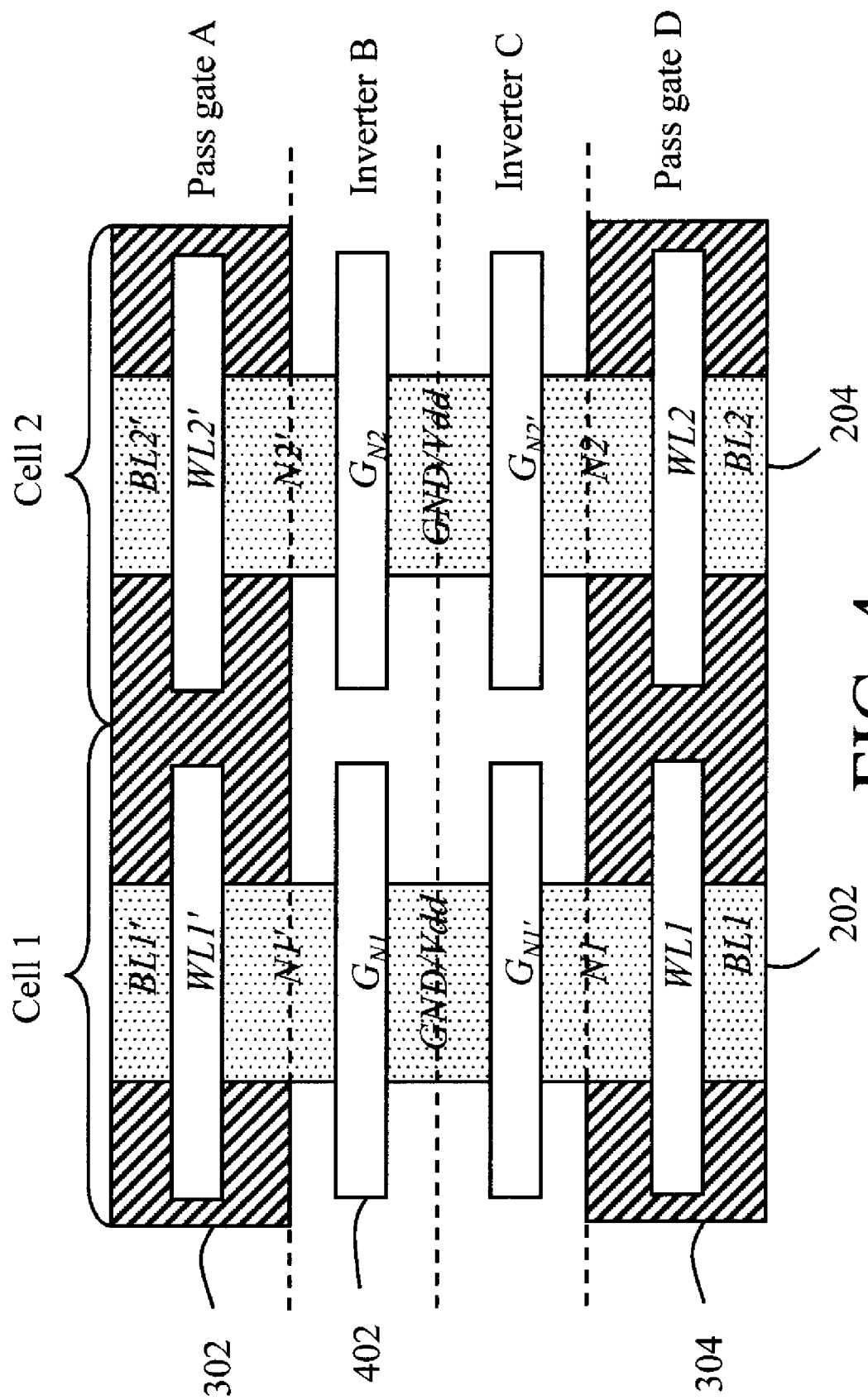
FIG. 4 is a top-down diagram illustrating the SRAM array above the gates according to an embodiment of the present invention.

FIG. 4 is a top-down diagram, for example from vantage point A (see FIG. 1), illustrating the SRAM array above the gates. As highlighted above, the SRAM array includes two of the four gate 6T SRAM cells, i.e., eight gates 402 in total corresponding to four pass gates and four inverters. For illustrative purposes, the bit lines (BL, BL'), word lines (WL, WL') and internal storage nodes (N, N', $G_N$, $G_{N'}$) of the device are labeled for Cell 1 and Cell 2. This configuration is merely exemplary and other source/drain region and gate layouts are possible. However, it is preferred that regular patterns are employed (see below).

Specifically, as highlighted above, in each pass gate one source/drain region acts as a bit line contact (labeled BL and BL', accordingly for the two pass gates), the other source/drain region acts as an internal storage node (labeled N and N', accordingly for the two pass gates) and the gate acts as a word line (labeled WL and WL', accordingly for the two pass gates). Further, as shown in FIG. 4, the given pass gate source/drain region that acts as an internal storage node is common to the adjacent inverter and thus also serves as an output node ($V_{out}$) for that inverter (i.e., the region is a common output node/internal storage node). As also highlighted above, in each inverter the source regions of the PFET device layers serve as power ($V_{dd}$) nodes to the inverters and the source regions of the NFET device layers serve as ground (Gnd) nodes to the inverters (labeled GND/$V_{dd}$, accordingly). As shown in FIG. 4, this region is common to both inverters. As highlighted above, in each inverter the gate serves as an input ($V_{in}$) to the inverters (labeled $G_N$ and $G_{N'}$, accordingly for the two inverters). The storage element in an SRAM cell is a pair of cross-coupled inverters. To cross-couple inverters their inputs are tied into each other's outputs and that forms the internal storage node.

Figure 5:
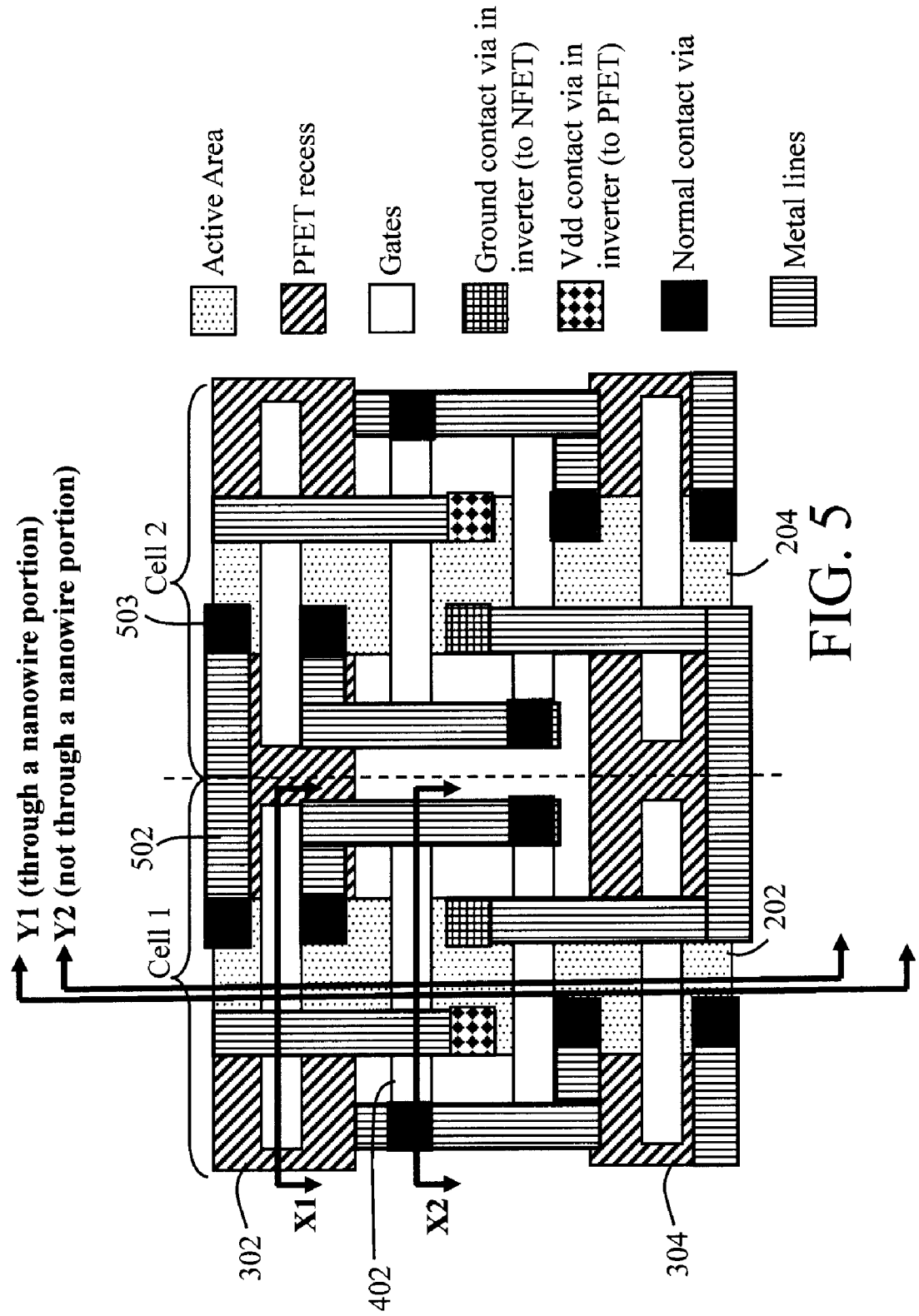
FIG. 5 is a top-down diagram illustrating metal lines and contact vias of the SRAM array according to an embodiment of the present invention.

FIG. 5 is a top-down diagram, for example from vantage point A (see FIG. 1), illustrating the SRAM array above metal lines 502 and contact vias 503. Contact vias connect the source/drain contact regions to the metal lines above. Metal lines 502 interconnect the source/drain regions and gates of the pass gates and inverters. A key to the various layers/structures is provided on the right. Of particular note are the power ($V_{dd}$) and ground (Gnd) contact vias in the inverters. Reference to FIG. 1 reveals that these $V_{dd}$ and Gnd contact vias contact the PFET and NFET source region contacts 122 and 124, respectively, in the inverters. Contact vias and the metal lines that interconnect them are formed/placed using conventional processes well known to those of skill in the art, and thus are not described further herein.

As FIGS. 2-5 clearly show, the instant SRAM design advantageously employs a gridded design active area and gate design with regular patterns. Such a gridded design enables more regular lithography which lowers variations, both at the patterning stages and during subsequent processing, and reduces sensitivity to misalignment between gate and active area. Namely, for advanced lithography techniques, a regular pattern of lines and spaces at constant pitch is the best possible case to print. The limit of this variation is a function of the optics and photoresist. Any deviations from regular pitch lines (i.e., corners) requires proximity correction techniques and these typically lead to corner rounding variations that are large compared to the initial lithography variation.

A process for fabricating an SRAM cell, such as SRAM cell 100 described in conjunction with the description of FIG. 1 above, will now be presented. The fabrication process will be described by way of reference to two- and three-dimensional cross-sections. The two-dimensional cross-sections are taken through X and Y planes of the cell, and in some instances cross-sections through different X planes (e.g., X1 and X2) will be shown and described to illustrate differences in the fabrication process between pass gate and inverter formation. Further, in some instances cross-sections through different Y planes (e.g., Y1 and Y2) will be shown and described to illustrate differences in the nanowire versus non-nanowire portions of the structure. Reference may be made to FIG. 1 for a key to the various planes (X, Y and Z) of the cell, and reference may be made to FIG. 5 for a key to the orientations of the cross-sections through the X and Y planes of the cell. As highlighted above, an advantage of the present SRAM cell fabrication techniques is that the pass gates can be fabricated along with the inverters in the same process. Further, the present techniques make use of a damascene gate process to construct source/drain regions that are self-aligned with the gate.

Figure 6:
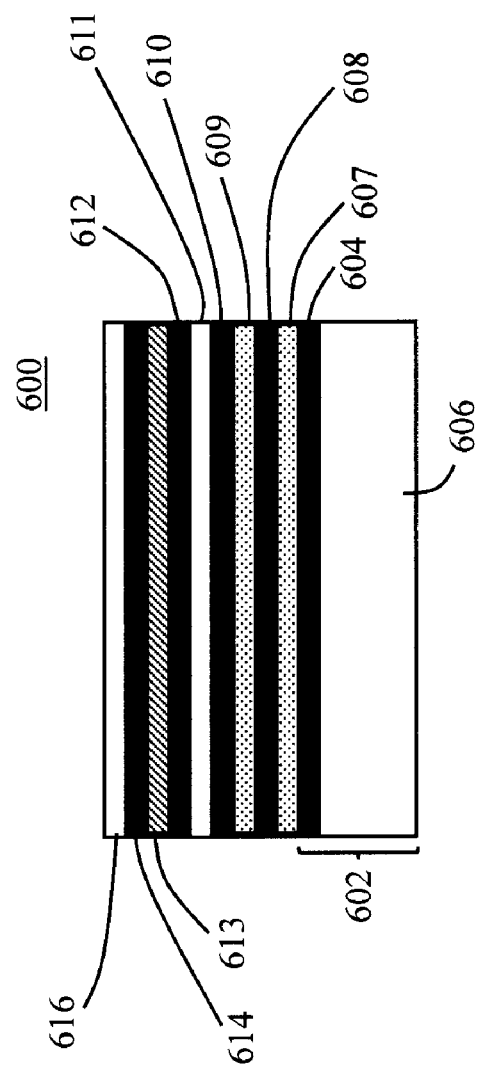
FIG. 6 is a two-dimensional cross-sectional diagram illustrating a starting structure for an SRAM cell fabrication process including silicon (Si), sacrificial and insulating layers formed on a silicon-on-insulator (SOI) wafer in a stack according to an embodiment of the present invention.

FIG. 6 is a two-dimensional cross-sectional diagram of a substrate before it has been patterned illustrating a starting structure 600 for the SRAM cell fabrication process. Specifically, structure 600 is the starting point for fabricating the pass gates and the inverters in the same process. To form structure 600, a wafer 602 is provided having a silicon-on-insulator (SOI) layer 604 over a buried oxide (BOX) layer 606. An SOI wafer commonly also includes other layers, such as a substrate adjacent to a side of the BOX layer opposite the SOI layer, which are not shown in this depiction. BOX layer 606 can comprise any suitable insulator material including, but not limited to, a dielectric material, such as silicon dioxide ($SiO_2$).

An alternating series of silicon (Si) and sacrificial layers are then formed on the wafer in a stack, with SOI layer 604 as the first Si layer in the series. Specifically, starting with SOI layer 604 and moving upward, a first sacrificial layer 607 is epitaxially grown over SOI layer 604.

Sacrificial layer 607 comprises a crystalline material which can be etched selectively to Si, such as silicon germanium (SiGe). Sacrificial layer 607 contains a high concentration of a dopant(s) which, when introduced into the Si layers (for example, by an anneal performed later in the process), result in either n-type or p-type Si. For example, phosphorous (P) or arsenic (As) are typical n-type dopants and boron (B) is a typical p-type dopant. Dopant concentrations of from about $1 \times 10^{19}$ atoms per cubic centimeter (atoms/cm$^3$) to about $1 \times 10^{22}$ atoms/cm$^3$ may be employed. The doping may be performed in-situ (i.e., dopants are incorporated during the growth of sacrificial layer 607) or ex-situ (after the growth of sacrificial layer 607, using techniques such as ion implantation), with ex-situ doping being preferred if adjacent n-type and p-type doped regions are needed to form adjacent NFETs and PFETs in the same layer.

An optional undoped crystalline Si layer 608 may be epitaxially grown over sacrificial layer 607. Further, one or more additional sacrificial layers and/or crystalline Si layers may optionally be epitaxially grown in an alternating fashion on top of Si layer 608, in which the properties of the additional sacrificial layer(s) are the same as sacrificial layer 607, and the properties of the additional crystalline Si layer(s) are the same as Si layer 608. For illustrative purposes and ease of depiction, one additional sacrificial layer 609 and one additional Si layer 610 are shown on top of Si layer 608. However, as highlighted above, these layers are optional, and embodiments are anticipated herein where these layers are not present. Further, more or fewer of these layers may be present than are shown. According to an exemplary embodiment, the same doping is present in sacrificial layers 607 and 609.

Next, an electrically insulating layer 611 is deposited on the stack. In the exemplary configuration shown in FIG. 6, insulating layer 611 is deposited over Si layer 610. Insulating layer 611 may be deposited using chemical vapor deposition (CVD), plasma enhanced CVD (PECVD) or any suitable technique for dielectric deposition that does not induce a physical or chemical change to Si layer 610. According to an exemplary embodiment, insulating layer 611 comprises either a crystalline electrically insulating material, such as diamond, or an amorphous electrically insulating material, such as $SiO_2$.

A crystalline Si layer 612 is then formed over insulating layer 611. In the case where insulating layer 611 comprises a crystalline electrically insulating material, Si layer 612 may be epitaxially grown on insulating layer 611. In the case where insulating layer 611 comprises an amorphous electrically insulating material, Si layer 612 may be introduced on top of insulating layer 611 through wafer bonding techniques, for example, where crystalline Si layer 612 is transferred from a handle wafer.

One or more additional sacrificial layers and/or crystalline Si layers may optionally be epitaxially grown in an alternating fashion on top of Si layer 612. For illustrative purposes and ease of depiction, one sacrificial layer 613 and one Si layer 614 are shown on top of Si layer 612. However, as highlighted above, these layers are optional, and embodiments are anticipated herein where these layers are not present. Further, more or fewer of these layers may be present than are shown.

The sacrificial layer(s) above insulating layer 611, if present, have the same properties as the sacrificial layer(s) below insulating layer 611 (e.g., sacrificial layers 607 and 609). However, the polarity of the doping in the sacrificial layer(s) above insulating layer 611 is opposite to the doping in the sacrificial layer(s) below insulating layer 611. For example, if the doping in the sacrificial layer(s) below insulating layer 611 is n-type, then the doping in the sacrificial layer(s) above insulating layer 611 is p-type, and vice versa. Unlike the sacrificial layer(s) below insulating layer 611, the sacrificial layer(s) above insulating layer 611 may optionally be left undoped.

The electrically insulating layer and the Si and sacrificial layers above the electrically insulating layer will remain only in the inverter devices (these layers are removed from portions of the stack that will form the pass gates) (see below). Thus, to attain the exemplary configuration described above wherein the pass gate comprises NFET transistors, in one exemplary embodiment the sacrificial layer(s) above the electrically insulating layer are doped with a p-type dopant and the sacrificial layer(s) below the electrically insulating layer are doped with an n-type dopant (wherein an anneal performed later on in the process is used to diffuse these dopants into the device layers).

According to an exemplary embodiment, in the case where crystalline Si layer 612 is transferred through wafer bonding from a handle wafer (see above), the alternating sacrificial layer(s) and/or crystalline Si layer(s) above insulating layer 611, if present, may be grown on the handle wafer before growth of crystalline Si layer 612, and transferred to the starting substrate at the same time that crystalline Si layer 612 is transferred.

A hardmask is then deposited on the stack. This hardmask will be used only in formation of the inverters (and will be removed from the pass gates, as described below). Further this hardmask is the first of a two layer (dual) hardmask structure for the inverters. Therefore, this hardmask layer is referred to herein as a "first inverter hardmask," i.e., first inverter hardmask 616. In the exemplary configuration shown in FIG. 6, first inverter hardmask 616 is deposited over Si layer 614. First inverter hardmask 616 can have the same composition (e.g., $SiO_2$) and can be deposited in the same manner as insulating layer 611. According to an exemplary embodiment, first inverter hardmask 616 has a thickness of from about 15 nanometers (nm) to about 20 nm, e.g., about 20 nm.

As described above, each sacrificial layer may be deposited by way of an epitaxial growth process. As such, each sacrificial layer comprises a single crystalline material. According to an exemplary embodiment, each sacrificial layer has a thickness of from about five nm to about 20 nm. However, to minimize parasitic capacitance, the thickness of each sacrificial layer should be as small as possible while still leaving enough room for a gate dielectric/gate to fit in the gap formed once the sacrificial layer is removed later on in the process. Similarly, each Si layer described above may be deposited by way of an epitaxial growth process. As such, each Si layer also comprises a single crystalline material. According to an exemplary embodiment, each Si layer has a thickness of from about five nm to about 20 nm.

The epitaxial growth process used to form the Si and/or sacrificial layers may be performed at a temperature of less than about 800 degrees Celsius (° C.), e.g., less than about 650° C. The process can be carried out without breaking vacuum between the growth of each layer, or alternatively, vacuum can be broken between layers to enable extra processing, e.g., ex-situ doping of a particular layer. Notwithstanding whether the vacuum is broken or not between layers, a purge step is preferably performed between each successive layer formation. The growth pressure employed in forming each of the Si and sacrificial layers is less than about 100 ton, e.g., less than about 50 torr. It is notable that with these exemplary epitaxial growth parameters the thickness of each of the Si and sacrificial layers should vary by no more than about five percent (%).

The SOI wafer and Si/sacrificial layer stack which makes up starting structure 600 is, at this point in the process, the same for both the pass gate and inverter fabrication. In the starting structure 600, STI is used to define an active area in SOI wafer 602. The active area defined in the wafer will be common to, i.e., shared by, all of the transistors of the SRAM cell. FIGS. 7A-C are two-dimensional cross-sectional diagrams through planes X1, X2 and either Y1 or Y2 (which would be the same at this point in the process), respectively, (see FIG. 5) illustrating the definition of an active area 702 by STI patterning. A STI scheme, e.g., nitride liner 704 and oxide fill 706, provides active area isolation (e.g., isolating active areas from one another). STI patterning techniques are known to those of skill in the art and thus are not described further herein. Active area 702 corresponds, for example, to one of the active areas 202 or 204 in FIG. 2 (described above).

A nitride hardmask 708 is deposited over the stack, which will serve to mask off portions of the active area where the inverters will reside, see below. Thus, portions of nitride hardmask 708 are subsequently removed from pass gate regions of the cell.

Figure 8A:
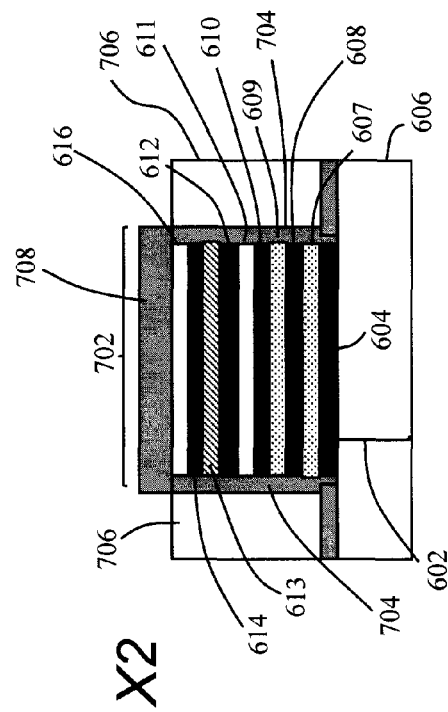
FIGS. 8A-C are two-dimensional cross-sectional diagrams illustrating the upper Si/sacrificial layers having been removed from the stack in areas where pass gate transistors will be formed according to an embodiment of the present invention.
Figure 8B:
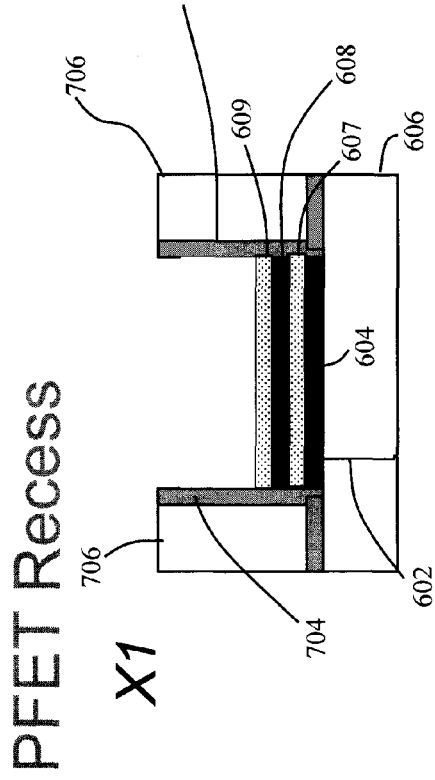
Figure 8C:
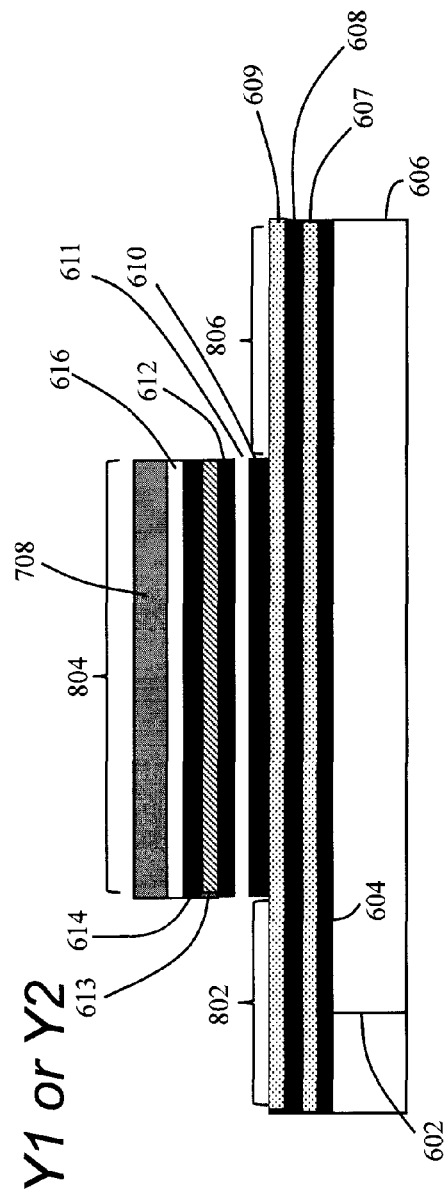

FIGS. 8A-C are two-dimensional cross-sectional diagrams through planes X1, X2 and either Y1 or Y2 (which would be the same at this point in the process), respectively, (see FIG. 5) of the active region, with portions of the active region where the pass gates will reside having been recessed to remove some of the upper layers originally present in starting structure 600. To accomplish this, a hardmask (e.g., silicon nitride (such as nitride hardmask 708) or silicon oxide, patterned with lithography of reactive ion etching) or a softmask (e.g., a carbon-based resist patterned with lithography) may be used to mask off the portions of the active area where the inverters will reside. A subtractive process such as reactive ion etching (RIE) is then used to selectively remove the upper Si/sacrificial layers from the stack in areas where the pass gate transistors will be formed. These upper layers are used in the inverters, but not in the pass gates. Specifically, in this instant example, Si layers 610, 612 and 614, electrically insulating layer 611, sacrificial layer 613 and first inverter hardmask 616 are removed from the pass gate regions. See FIGS. 8A and 8C, and below.

This configuration is merely exemplary, as other configurations are possible. For example, alternatively, only the layers above electrically insulating layer 611 may be removed (i.e., the PFET layers) from the pass gate regions, leaving the insulating layer and everything below it intact (not shown). However, for the pass gates to have a smaller number of channels and thus be weaker than the pull-downs (which can be desirable for SRAM read stability), the electrically insulating layer and some of the layers (i.e., the top NFET layer(s)) below may be removed, as illustrated in FIGS. 8A-C and in the figures thereafter.

The steps used to selectively remove these upper layers would be apparent to one of ordinary skill in the art and thus are not described further herein. The pass gates will be formed in regions 802 and 806 of the active area, and the inverters will be formed in region 804 of the active area. As described above, and as will be apparent from the following description of the process, the inverters will contain both PFET and NFET device layers, whereas the pass gates will contain only NFET device layers. According to an exemplary embodiment, such as is illustrated in FIG. 1 (described above), in the inverters the PFET layers are located above the electrically insulating layer. Thus, in this example, by selectively removing the electrically insulating layer and every layer thereabove in the pass gate regions of the active area, the PFET device layers are effectively removed leaving only NFET device layers in the pass gate regions.

The top-most remaining layer of the stack in regions 802 and 806 is sacrificial layer 609. Sacrificial layer 609 will serve as a first of two hardmask layers that will be used to pattern the nanowire channels in the pass gates (a dual nanowire hardmask structure) and preferably comprises an oxide, such as $SiO_2$. As such, sacrificial layer 609 may also be referred to herein as a "first pass gate hardmask."

FIGS. 9A-C are two-dimensional cross-sectional diagrams through planes X1, X2 and either Y1 or Y2 (which would be the same at this point in the process), respectively, (see FIG. 5) illustrating remaining portions of nitride hardmask 708 over the inverter regions having been removed. Namely, as described above, nitride hardmask 708 served to mask off the inverter regions of the cell during pass gate recess. These remaining portions of the hardmask are now removed from the areas where the inverters will be formed.

Figure 10A:
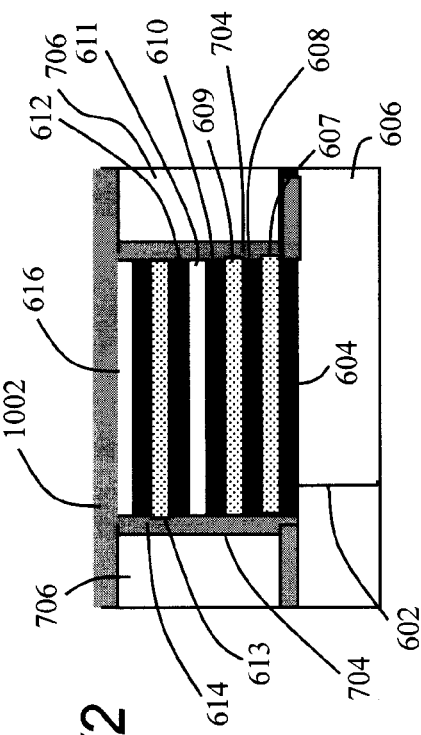
FIGS. 10A-C are two-dimensional cross-sectional diagrams illustrating a hardmask, which is part of a dual hardmask structure, having been deposited over the stacks according to an embodiment of the present invention.
Figure 10B:
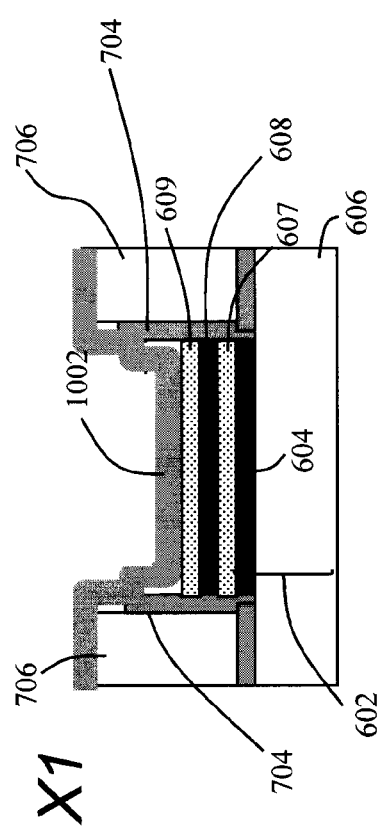
Figure 10C:
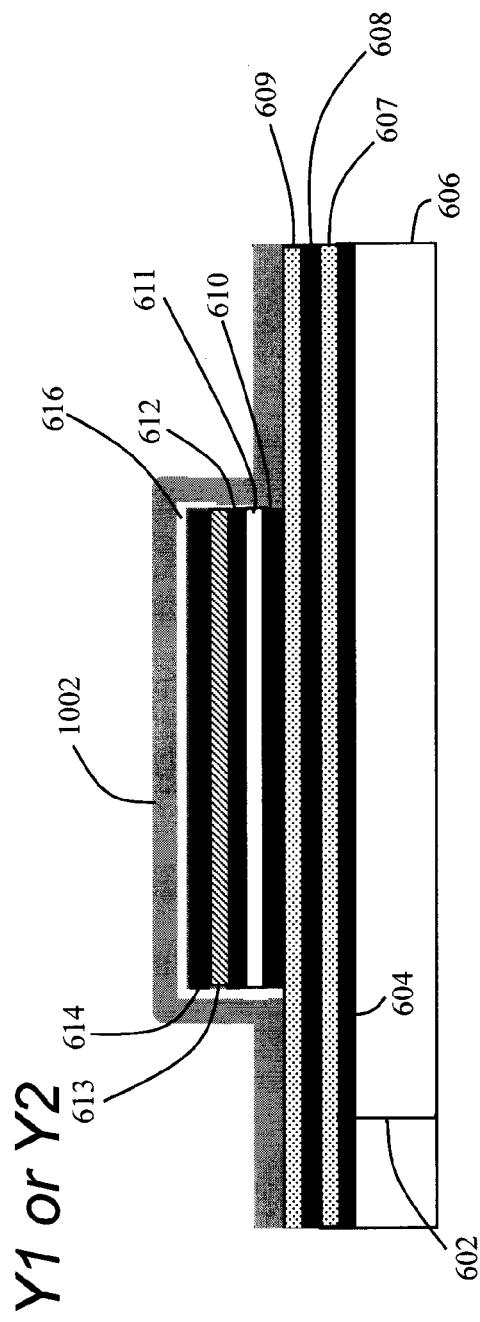

FIGS. 10A-C are two-dimensional cross-sectional diagrams through planes X1, X2 and either Y1 or Y2 (which would be the same at this point in the process), respectively, (see FIG. 5) illustrating a second hardmask 1002 having been deposited over the stacks (which will be patterned into nanowire hardmasks). According to an exemplary embodiment, the second hardmask comprises a nitride layer and is deposited using low-pressure chemical vapor deposition (LPCVD) to a thickness of from about five nm to about 20 nm, e.g., about five nm. As will be described in detail below, the first and second pass gate hardmasks and the first and second inverter hardmasks will be patterned (in accordance with a desired location of the nanowires along the X plane of the cell) into a plurality of individual nanowire hardmasks of each of the devices.

Figure 11D:
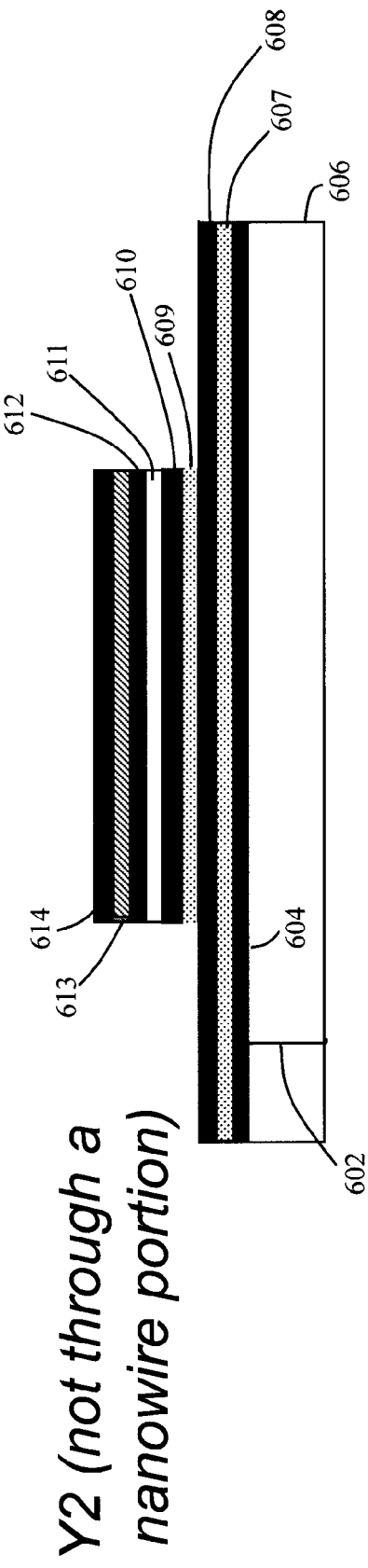

FIGS. 11A-D are two-dimensional cross-sectional diagrams through planes X1, X2, Y1 and Y2, respectively, (see FIG. 5) illustrating the first and second pass gate (in regions 802 and 806) and inverter (in region 804) (see FIG. 8) hardmasks patterned into a plurality of individual nanowire hardmasks. Specifically, in regions 802, 804 and 806, the hardmasks are patterned into a plurality of individual hardmasks 1122, 1132/1142 and 1152, respectively. As highlighted above, the patterning of the hardmasks is commensurate with a desired location of the nanowires along the X plane of each pass gate (FIG. 11A) or inverter (FIG. 11B). Along the Y plane, the hardmask patterns may be continuous across multiple devices, or may be discontinuous (as depicted in FIG. 11C), as long as terminations are not beneath where the dummy gate will be patterned (see below). According to an exemplary embodiment, a resist film (not shown) is deposited on the stack and patterned with the footprint and location of each of the individual nanowire hardmasks 1122, 1132, 1142 and 1152. In one example, electron beam (e-beam) lithography and reactive ion etching (RIE) are used to form the nanowire hardmasks, and therefore the resist film comprises a resist material such as hydrogen silsesquioxane (HSQ) patterned using e-beam lithography and transferred to a carbon-based resist.

A hardmask open stage is then performed using a series of selective RIE steps based on the fact that the first pass gate/inverter hardmask comprises, e.g., an oxide, while the second pass gate/inverter hardmask comprises a nitride. For example, a nitride-selective RIE using the resist film (not shown) as a mask is first used to remove all but the portions of second hardmask 1002 (see FIG. 10) beneath the resist film, defining nitride portions 1122a, 1132a, 1142a and 1152a of the nanowire hardmasks. An overetch may be required to clear stringers that form over the topology in the structure. The first hardmask which comprises, e.g., an oxide, acts as an etch stop for the nitride-selective RIE.

Next, using the nitride portions as a mask, an oxide-selective RIE is used to remove all but the portions of first hardmasks 609 and 616 beneath the nitride masks 1122a/1152a and 1132a/1142a, respectively, defining oxide portions 1122b/1152b and 1132b/1142b of the nanowire hardmasks, respectively (with Si layers 608 and 614, respectively, acting as etch stops for the oxide-selective RIE). An overetch may be required to clear stringers that form over the topology in the structure. Nitride portions 1122a, 1132a, 1142a and 1152a, and oxide portions 1122b, 1132b, 1142b and 1152b form dual nanowire hardmask structures over the pass gate and inverter stacks. In this example, the nanowire hardmasks 1122 are configured to have a pitch, i.e., a spatial frequency in region 802, of less than about 200 nm, for example, from about 10 nm to about 200 nm, e.g., from about 40 nm to about 50 nm. Nanowire hardmasks 1132/1142 and 1152 are also configured to have a pitch within these ranges in regions 804 and 806, respectively. To maximize layout density and minimize parasitic capacitance, the pitch should be as small as possible within patterning and processing limits. To achieve pitches smaller than what can be defined by direct lithography, a pitch doubling technique such as sidewall image transfer or double patterning/double etching could be used. A width 1123 (see, e.g., FIGS. 11A and 11B) of each of the nanowire hardmasks 1122, 1132, 1142 and 1152 is less than about 40 nm, for example, from about five nm to about 40 nm, e.g., from about five nm to about 10 nm. The pitch/width of the nanowire hardmasks will determine a pitch/width of the nanowires in the corresponding pass gates and inverters.

While FIG. 11C shows a cross-section through the patterned hardmasks and hence through a portion of the stack in which nanowires will be formed (i.e., through plane Y1), FIG. 11D on the other hand is a two-dimensional cross-sectional diagram through plane Y2 (see FIG. 5) illustrating the stack in between the individual nanowire hardmasks (i.e., through a portion of the structure where no nanowires will be formed). It is notable that the first and second hardmasks, now patterned, are not present in this depiction.

FIGS. 12A-D are two-dimensional cross-sectional diagrams through planes X1, X2, Y1 and Y2, respectively, (see FIG. 5) illustrating dummy gates formed over the pass gate and inverter stacks. As shown in FIGS. 12A-D, an oxide stopping layer, i.e., oxide layer 1202, is formed on the topmost layer of each stack, i.e., on Si layers 608 and 614. According to an exemplary embodiment, thermal oxidation is used to grow this oxide layer to a thickness of up to about four nm, e.g., up to about two nm. A portion of each of the top Si layers is consumed during this thermal oxidation process. Thus, Si layers 608 and 614 are each reduced in thickness, for example, by about two nm, e.g., by up to about one nm, in the areas wherein the oxide layer is formed.

To begin the damascene gate process, dummy gate structures 1246, 1248, 1250 and 1252 are formed. As will be apparent from the description that follows, the dummy gate structures define both a location of the nanowires along the Y plane as well as a location of a gate of each corresponding pass gate or inverter. According to an exemplary embodiment, the dummy gate structures each comprise polycrystalline Si (polysilicon).

Dummy gate structures 1246, 1248, 1250 and 1252 can be formed by the following process. A polysilicon layer is first deposited over the oxide layers (i.e., oxide layer 1202) and the nanowire hardmasks (i.e., nanowire hardmasks 1122, 1132, 1142 and 1152) using LPCVD to a thickness of from about 100 nm to about 150 nm, e.g., about 140 nm. Since the thickness of the polysilicon layer will determine a height of the dummy gate, chemical-mechanical polishing (CMP) may be used after deposition to achieve a desired thickness/height. A resist film (not shown) is deposited on the polysilicon layer, masked and patterned with a footprint and location of each of the dummy gates (over what is to be the nanowire channels of each pass gate and inverter). Polysilicon-selective RIE is then used to remove all but portions of the polysilicon layer located over the nanowire hardmasks (i.e., centered over the nanowire hardmasks along the Y plane), which are dummy gates 1246, 1248, 1250 and 1252. According to an exemplary embodiment, each of dummy gates 1246, 1248, 1250 and 1252 has a height 1228 of from about 100 nm to about 150 nm, e.g., about 140 nm, and a length 1230 of from about 30 nm to about 50 nm, e.g., about 45 nm.

As indicated by arrows 1232, a top-down implant may optionally be used to dope one or more of the crystalline Si layers, such as Si layers 608 and/or 614. The conditions for this implant are well known to those skilled in the art and may vary depending on the type of dopant species employed. This implant may be used to optimize or replace the doping provided by the sacrificial layers (assuming the stack thickness allows a conventional implant), if necessary or desired.

Figure 12A:
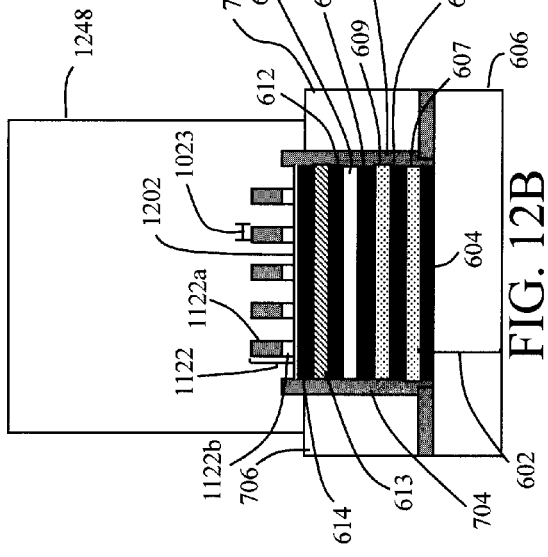
FIGS. 12A-D are two-dimensional cross-sectional diagrams illustrating dummy gates formed over the pass gate and inverter stacks according to an embodiment of the present invention.
Figure 12B:
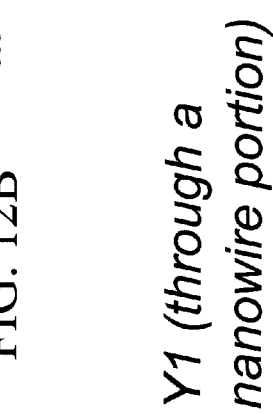
Figure 12C:
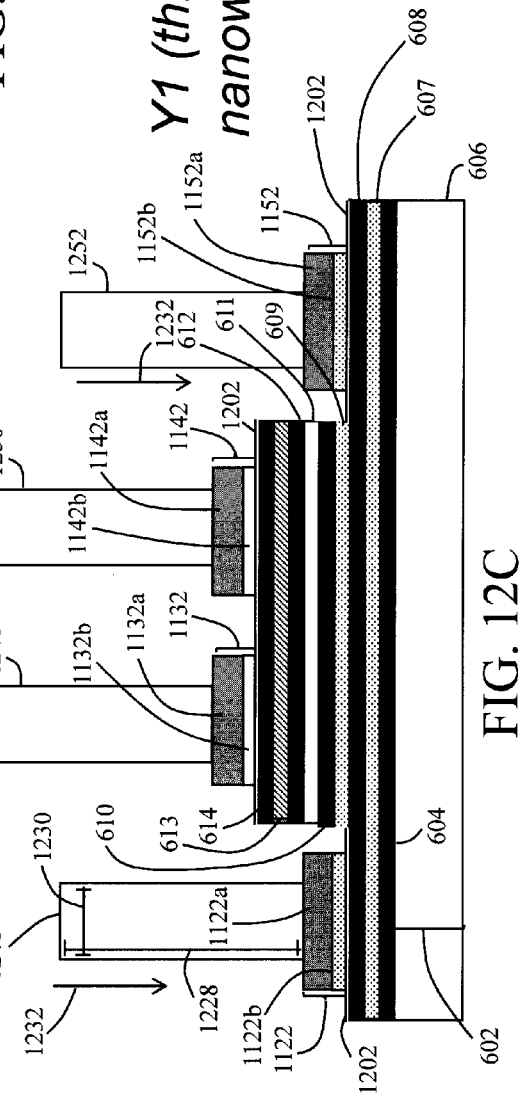
Figure 12D:
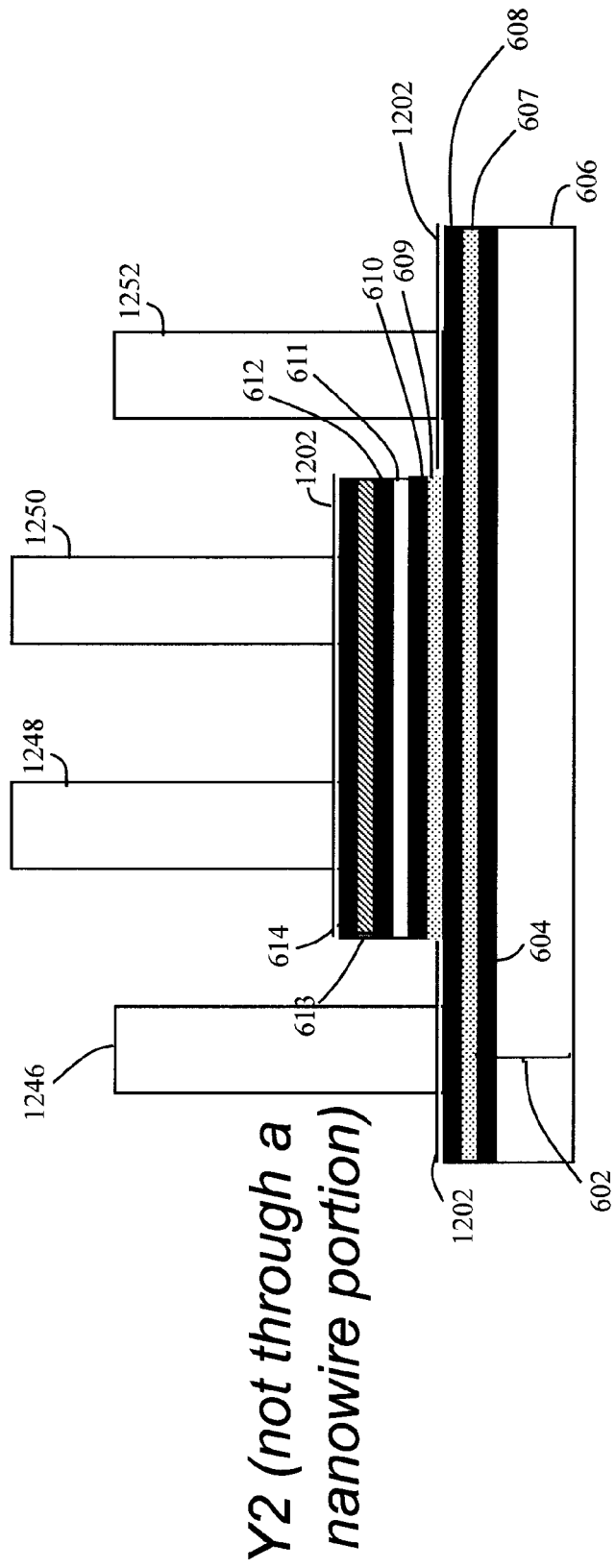

While FIG. 12C shows a cross-section through the dummy gates and a portion of the stack in which nanowires will be formed (i.e., through plane Y1), FIG. 12D on the other hand is a two-dimensional cross-sectional diagram through plane Y2 (see FIG. 5), i.e., through the dummy gates and a portion of the stack in which no nanowires will be formed. It is notable that the patterned nanowire hardmasks are not present in this depiction.

FIGS. 13A-D are two-dimensional cross-sectional diagrams through planes X1, X2, Y1 and Y2, respectively, (see FIG. 5) illustrating the nanowire hardmasks trimmed around the dummy gates. Portions of the nanowire hardmasks 1122, 1132, 1142 and 1152 extending out from under dummy gates 1246, 1248, 1250 and 1252, respectively, can be removed using an anisotropic etch that is selective to the dummy gate material (i.e., does not etch the dummy gate). As indicated by arrows 1334, the top-down implant described in conjunction with the description of FIG. 12, above may instead be performed at this point in the process, i.e., after rather than before the removal of the portions of the nanowire hardmasks extending out from under the dummy gates.

Figure 13D:
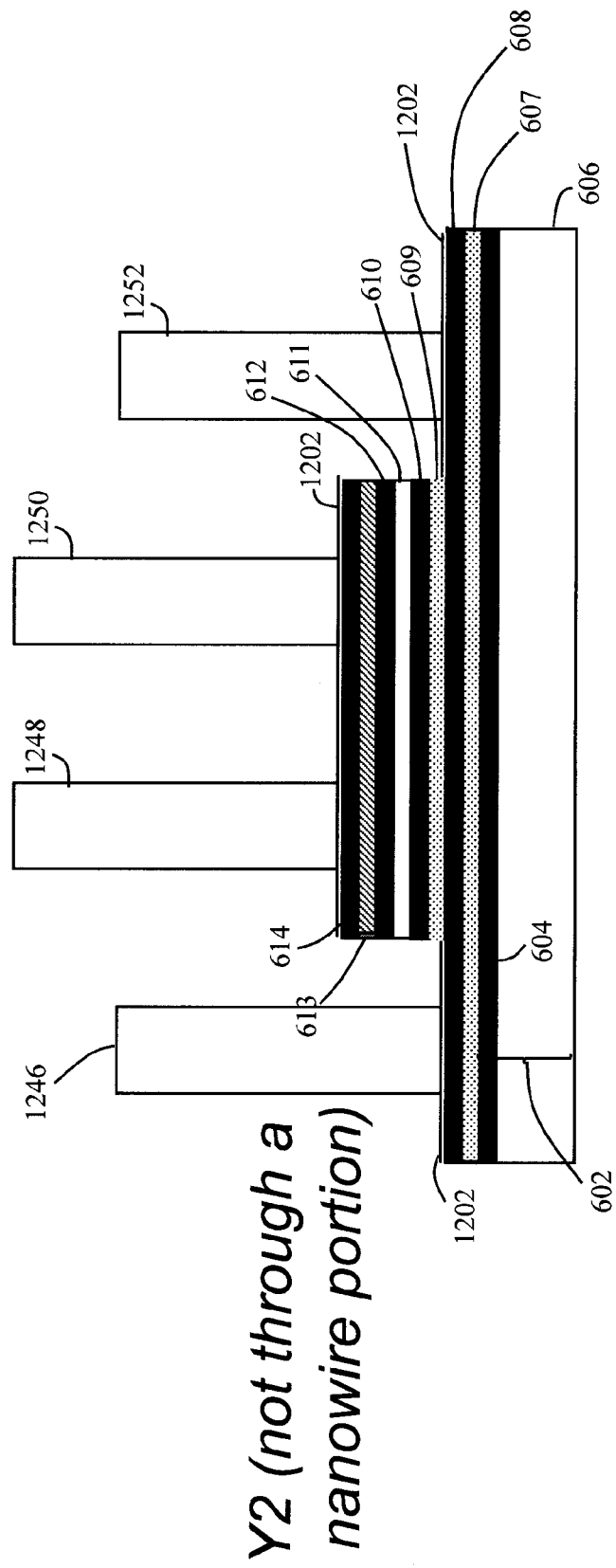

While FIG. 13C shows a cross-section through the dummy gates and a portion of the stack in which nanowires will be formed (i.e., through plane Y1), FIG. 13D on the other hand is a two-dimensional cross-sectional diagram through plane Y2 (see FIG. 5), i.e., through the dummy gates and a portion of the stack in which no nanowires will be formed. It is notable that the trimmed nanowire hardmasks are not present in this depiction.

FIGS. 14A-D are two-dimensional cross-sectional diagrams through planes X1, X2, Y1 and Y2, respectively, (see FIG. 5) illustrating (sacrificial) filler layer 1436 deposited around dummy gates 1246, 1248, 1250 and 1252. According to an exemplary embodiment, filler layer 1436 is formed from a single common layer that comprises a filler material, such as a dielectric material, e.g., $SiO_2$, that is deposited around each of the dummy gates using a high-density plasma (HDP). CMP is then used to planarize the filler material and dummy gates. Thus, the filler layer will have a thickness of from about 30 nm to about 150 nm, e.g., about 140 nm.

Figure 14D:
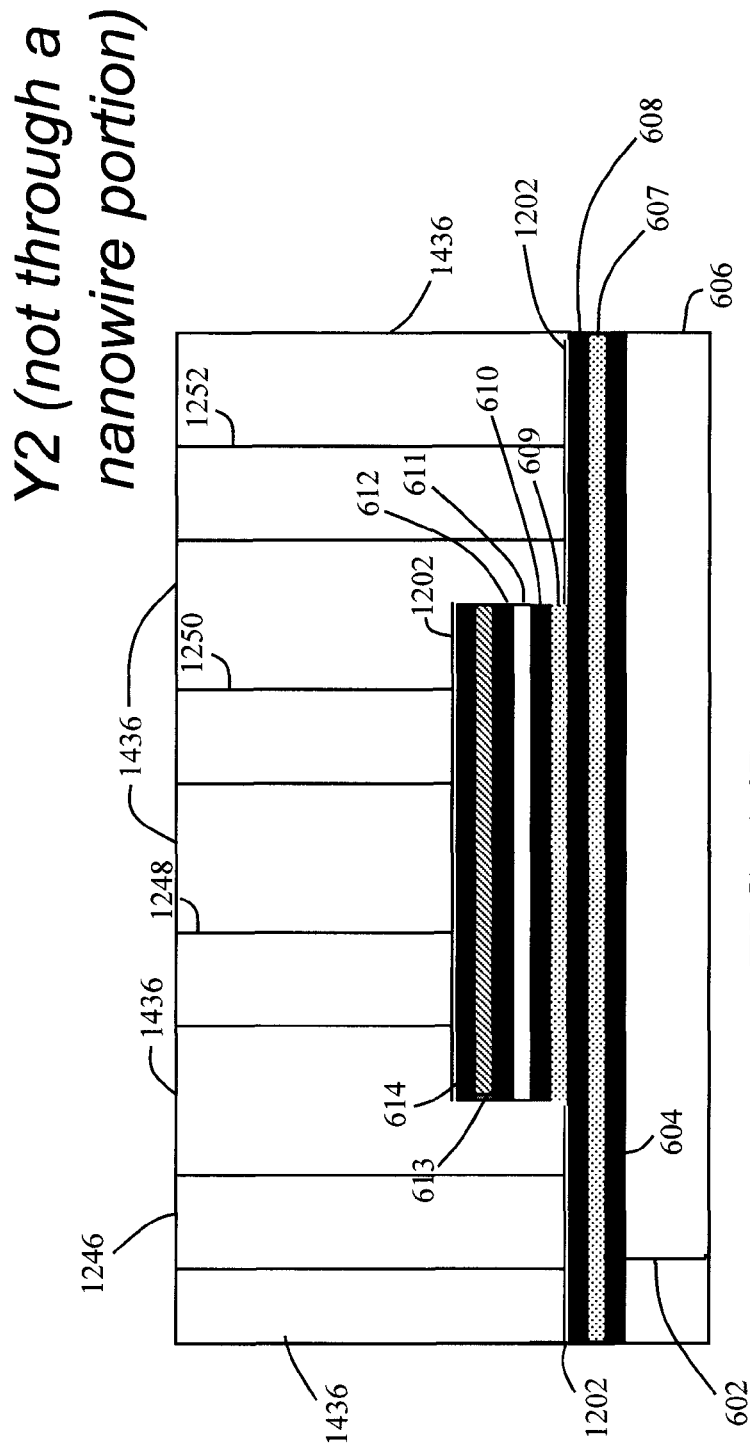

While FIG. 14C shows a cross-section through the filler layer, dummy gates and a portion of the stack in which nanowires will be formed (i.e., through plane Y1), FIG. 14D on the other hand is a two-dimensional cross-sectional diagram through plane Y2 (see FIG. 5), i.e., through the filler layer, dummy gates and a portion of the stack in which no nanowires will be formed. As above, it is notable that the trimmed nanowire hardmasks are not present in this depiction.

FIGS. 15A-D are two-dimensional cross-sectional diagrams through planes X1, X2, Y1 and Y2, respectively, (see FIG. 5) illustrating the dummy gates having been removed. Dummy gates 1246, 1248, 1250 and 1252 can be removed using a chemical etching process, such as chemical down stream or potassium hydroxide (KOH) etching, or RIE. As shown, for example, in FIG. 15C, removal of dummy gates 1246, 1248, 1250 and 1252 results in trenches 1546, 1548, 1550 and 1552, respectively, being formed in the filler layer. Since the trenches are a negative pattern of each dummy gate, the trenches are also centrally located (i.e., along the Y plane) over the nanowire hardmasks for each pass gate and inverter. According to an exemplary embodiment, the trenches distinguish a (nanowire) channel region from source and drain regions of the corresponding pass gate or inverter.

Figure 15D:
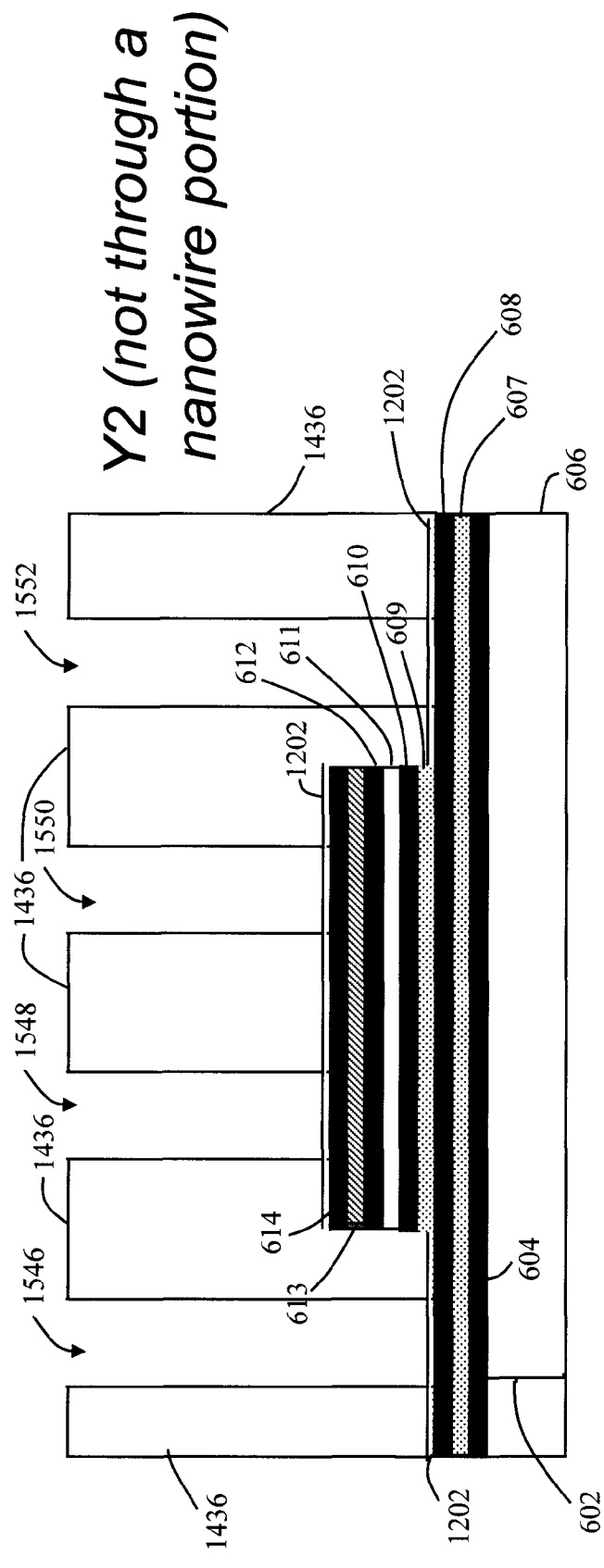

The use of dummy gates is an important aspect of the present techniques. Namely, the dummy gates allow for the nanowire hardmasks to be placed prior to the filler layer, such that when the dummy gates are removed, the nanowire hardmasks revealed are already present within the trenches. The nanowire channels are thus defined by the intersection of two sets of straight lines (i.e., the edge of the dummy gate and the edge of the nanowire hardmask) defined in two separate patterning steps. This produces patterns with well defined corners and thus a uniform nanowire thickness across the entire channel While FIG. 15C shows a cross-section through the filler layer and a portion of the stack in which nanowires will be formed (i.e., through plane Y1), FIG. 15D on the other hand is a two-dimensional cross-sectional diagram through plane Y2 (see FIG. 5), i.e., through the filler layer and a portion of the stack in which no nanowires will be formed. As above, it is notable that the nanowire hardmasks are not present in this depiction.

Figure 16D:
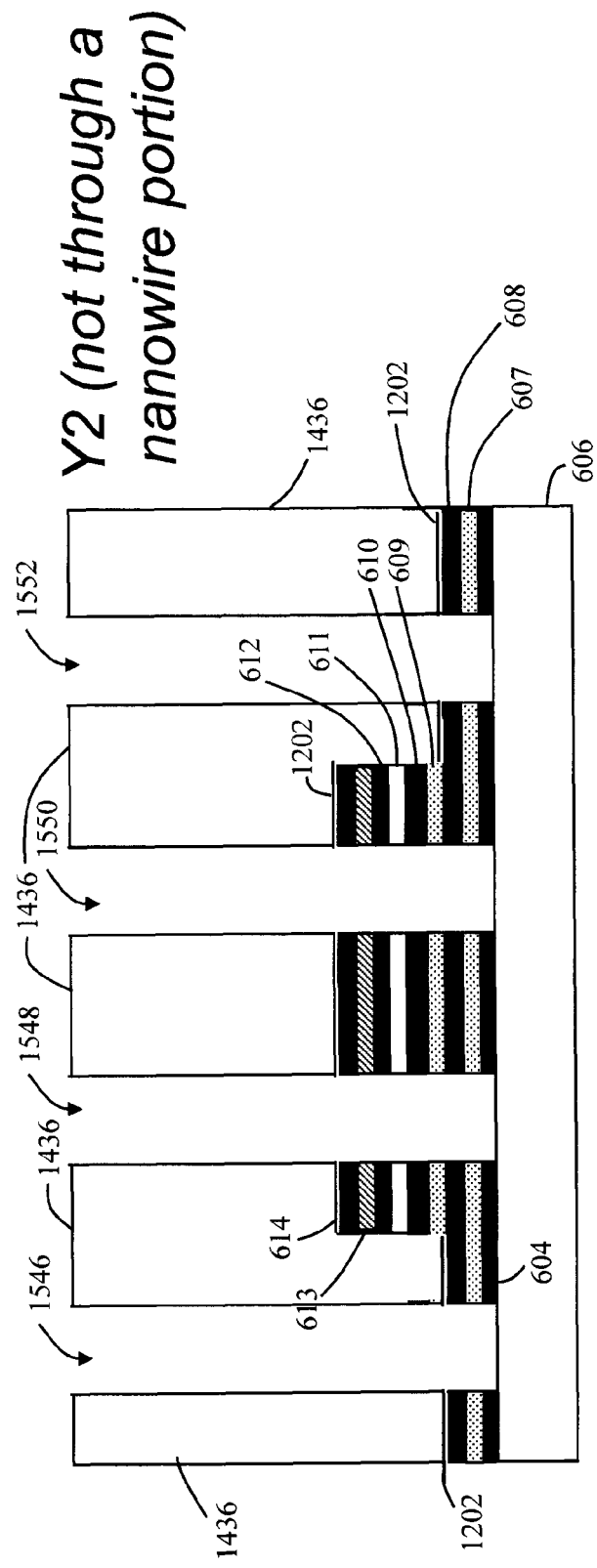

FIGS. 16A-D are cross-sectional diagrams through planes X1, X2, Y1 and Y2, respectively, (see FIG. 5) illustrating fin stacks 1640 and 1642 etched into the Si/sacrificial layers in pass gate and inverter regions 802 and 804, respectively. Further, FIG. 16A is representative of what the fin stack in the corresponding pass gate region 806 would look like. Similarly, FIG. 16B is representative of what the fin stack for the other inverter in region 804 would look like. Since FIG. 16C shows a cross-section through a portion of the stack in which nanowires will be formed the fin stacks, i.e., below the nanowire hardmasks, are intact in this view.

The fins formed in the Si layers, once released from the sacrificial layers as described below, will be the nanowire channels of the pass gates and inverters. According to an exemplary embodiment, a selective RIE is used to remove portions of the Si/sacrificial layers in trenches 1546, 1548, 1550 and 1552 not masked by the nanowire hardmasks. BOX layer 606 acts as an etch stop for the fin etch. The fin stacks patterned in this manner will have sharp, well-defined edges. As described above, this is a result of using a dual (nitride/oxide) hardmask to pattern the nanowires.

An advantage of the present teachings is that the fins are etched only within the trenches, leaving the source/drain regions of the pass gates and inverters intact below the respective filler layers. Further, the source/drain regions produced in this manner will be self-aligned with the trench and thus with a device gate that will be formed in the trench (see description below). For example, in region 802, the source/drain regions produced for this pass gate will be self-aligned with trench 1546 and thus with a device gate that will be formed in trench 1546.

Based on the pitch and width of nanowire hardmasks 1122, the fins formed in region 802 (including those formed in the Si layers that will be the nanowire channels of the pass gate) have a pitch, i.e., a spatial frequency, of less than about 200 nm, for example, from about 10 nm to about 200 nm, e.g., from about 40 nm to about 50 nm, and a width of less than about 40 nm, for example, from about five nm to about 40 nm. Similarly, the fins formed in regions 804 and 806 also have a pitch, i.e., a spatial frequency, within these ranges.

While, as highlighted above, FIG. 16C shows a cross-section through the filler layer and a portion of the stack in which nanowires will be formed (i.e., through plane Y1), FIG. 16D on the other hand is a two-dimensional cross-sectional diagram through plane Y2 (see FIG. 5), i.e., through the filler layer and a portion of the stack in which no nanowires will be formed. It is notable that in this view the fin stacks are not present and the fin etch through the stack is down to BOX layer 606.

FIGS. 17A-D are two-dimensional cross-sectional diagrams through planes X1, X2, Y1 and Y2, respectively, (see FIG. 5) illustrating any remaining exposed nitride portions 1122a, 1132a, 1142a and 1152a (i.e., portions within trench 1546, 1548, 1550 and 1552, respectively) of the nanowire hardmasks having been removed. Any etching process selective for removal of the nitride portions of the nanowire hardmasks relative to the oxide portions may be used. Ideally, however, the thickness of the nitride portion should have been chosen such that it is mostly consumed during the previous fin etch, so there should not be much left on the hardmask structure at this point. The oxide portions 1122b, 1132b, 1142b and 1152b of the hardmasks are ideally designed so that they are entirely consumed during the spacer etch (see, for example, FIGS. 18A-C, described below). Any of the oxide hardmasks remaining after the spacer etch should be thin enough to be removed during a gate stack pre-clean performed later in the process.

Figure 17D:
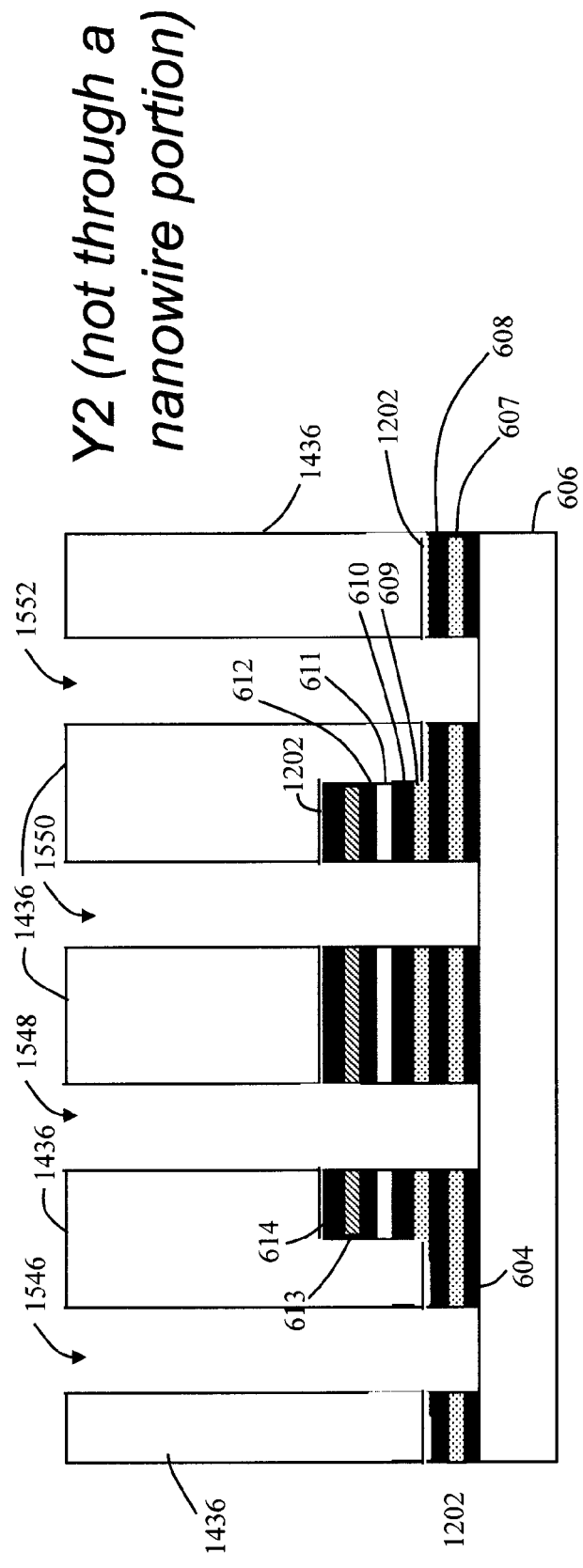

While FIG. 17C shows a cross-section through the oxide portions of the hardmasks and a portion of the stack in which nanowires will be formed (i.e., through plane Y1), FIG. 17D on the other hand is a two-dimensional cross-sectional diagram through plane Y2 (see FIG. 5), i.e., through a portion of the stack in which no nanowires will be formed. It is notable that the oxide portions of the hardmasks are not present in this depiction.

FIGS. 18A-D are cross-sectional diagrams through planes X1, X2, Y1 and Y2, respectively, (see FIG. 5) illustrating spacers 1842, 1844, 1846 and 1848 formed in trenches 1546, 1548, 1550 and 1552, respectively. This step is optional. Placing spacers between what will be the source/drain regions and the gates (that will be formed in the trenches) will help to minimize parasitic capacitance in the completed pass gate or inverter, but is not necessary for preventing gate-to-source/drain shorting during raised source/drain (RSD) epitaxial growth or silicide, i.e., as in typical FET flows. The spacers serve to offset the gates a certain distance from the source/drain regions.

According to an exemplary embodiment, the spacers are formed by first depositing a thin, conformal nitride, and then using an anisotropic nitride RIE to clear nitride from horizontal surfaces, leaving nitride spacers on all vertical sidewalls. A long timed overetch is then used to clear the sidewalls of the fin stacks, e.g., fin stacks 1640 and 1642, such that the spacers are present only along the sidewalls of the trenches and not on the fin stacks. See, for example, FIG. 18C wherein the spacers line the sidewalls of the trenches and do not cover the center portions of the fin stacks. The minimum pulldown of spacers 1842, 1844, 1846 and 1848 is thus the height of the corresponding fin stack and remaining (oxide portions) nanowire hardmasks. For example, the amount of overetch is between about 50% and about 80% of the etch time required to remove the entire nitride layer. According to an exemplary embodiment, each spacer has a length 1849 of from about five nm to about 25 nm. A maximum height of each spacer is equal to thickness 1839 of the corresponding trench less height 1850 of the spacer pulldown. A minimum height of the spacers is a height of the corresponding fin stack, e.g., height 1852, e.g., of fin stack 1640 and height 1854, e.g., of fin stack 1642. The oxide portions 1122b, 1132b, 1142b and 1152b of the hardmask are exposed during the long overetch required to removed the nitride layer, and will most likely be eroded during this step due to imperfect selectivity between the nitride etch used to remove the spacer. Ideally, the oxide portions of the hardmask are designed to be just thick enough to be completely eroded during this step while still protecting the fin stacks from erosion.

Figure 18D:
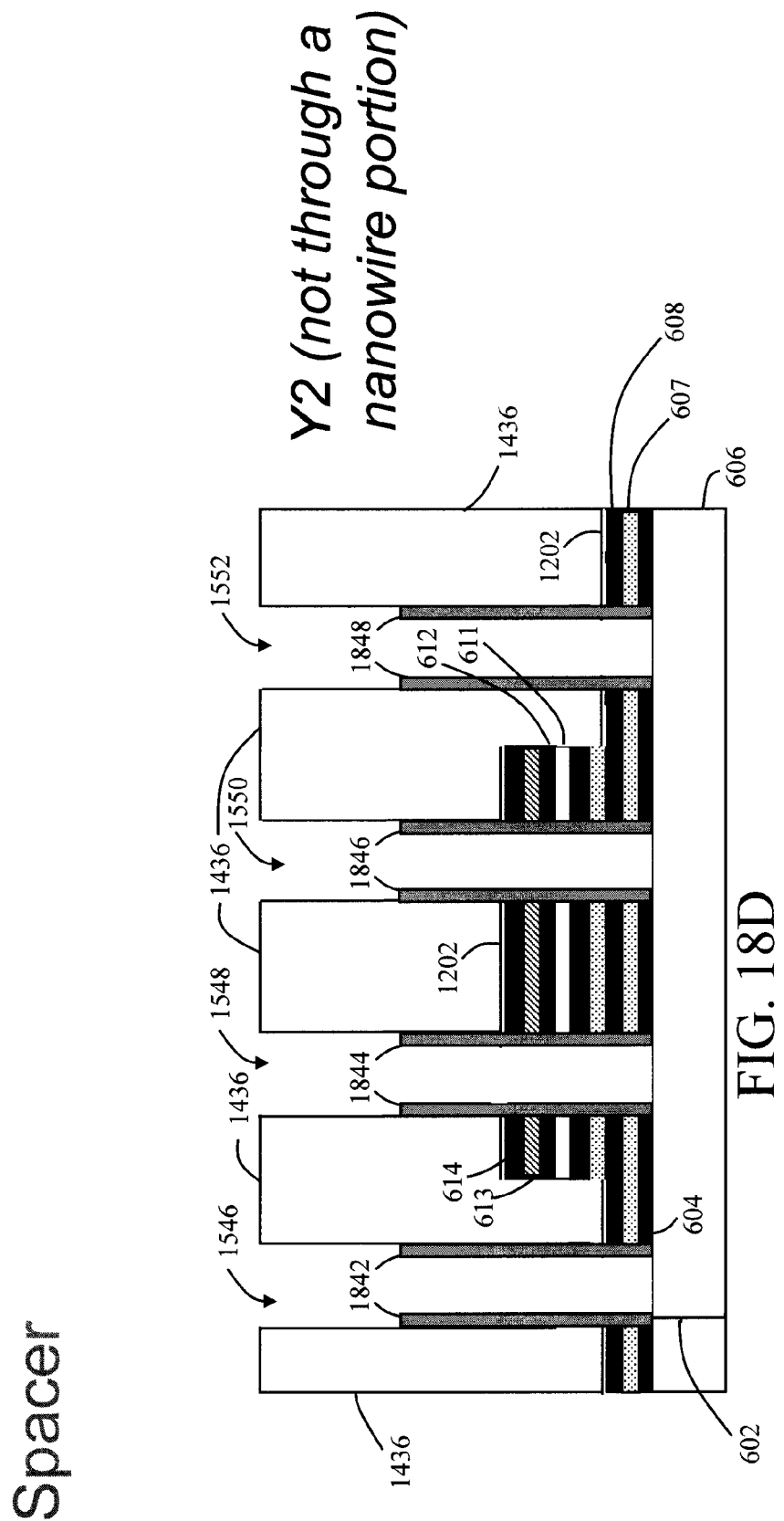

While FIG. 18C shows a cross-section through the spacers and a portion of the stack in which nanowires will be formed (i.e., through plane Y1), FIG. 18D on the other hand is a two-dimensional cross-sectional diagram through plane Y2 (see FIG. 5), i.e., through a portion of the stack in which no nanowires will be formed. It is notable that the spacers in this depiction extend down to BOX layer 606.

Figure 19D:
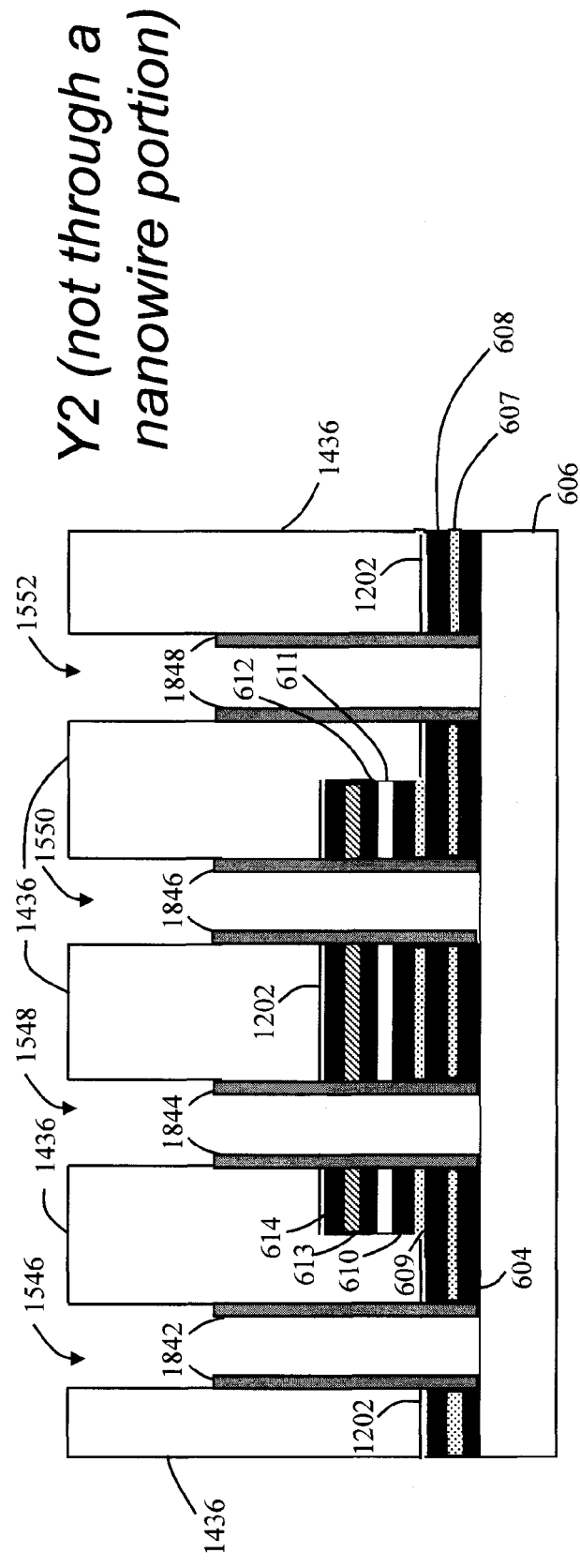

FIGS. 19A-D are two-dimensional cross-sectional diagrams through planes X1, X2, Y1 and Y2, respectively, (see FIG. 5) illustrating the sacrificial material having been removed from between the Si layers in each of the nanowire fin stacks. In region 802, the now released portions 604a and 608a of SOI layer 604 and Si layer 608, respectively, are the nanowire channels of one of the pass gates. Further, FIG. 19A is representative of what the fin stack in the corresponding pass gate region 806 would look like. In region 804, the now released portions 604b, 608b, 610b, 612b and 614b of SOI layer 604 and Si layers 608, 610, 612 and 614, respectively, are the nanowire channels of one of the inverters. Similarly, FIG. 19B is representative of what the fin stack for the other inverter in region 804 would look like. These multiple layers of nanowire channels are also referred to herein as a nanowire "mesh."

The sacrificial material may be removed from the fin stacks as follows. For a sacrificial material such as SiGe, a chemical etchant can be employed that exploits the lower oxidation potential of the sacrificial material as compared to the Si layers. Examples of such etchants include, but are not limited to a 1:2:3 mixture of $HF:H_2O_2:CH_3COOH$, or a mixture of $H_2SO_4$ and $H_2O_2$. Alternatively, the sacrificial layers can be selectively removed using a dry etching process such as oxygen ($O_2$) plasma etching or plasma chemistries typically used for etching. For a sacrificial electrically insulating material (layer 611) such as $SiO_2$, a timed etch in a dilute chemical etchant such as HF allows removal of the thin amount of material in between nanowire channels, while not removing significant portions of the $SiO_2$ elsewhere in the structure. According to an exemplary embodiment, the electrically insulating material (layer 611) present between nanowire channels is released in the gate stack preclean step described below.

At this point in the fabrication process, distinct layers of the pass gates and inverters are distinguishable. These layers are also referred to herein as device layers since each layer includes a source region, a drain region and a plurality of nanowire channels connecting the source region and the drain region. For example, by way of reference to the pass gate in region 802, portions of SOI layer 604 and Si layer 608 under filler layer 1436 are source and drain regions of the pass gate, and as highlighted above, portions 604a and 608a, of SOI layer 604 and Si layer 608, respectively, are nanowire channels of the pass gate that connect the source region and the drain region.

As highlighted above, the inverters will contain both PFET and NFET device layers, whereas the pass gates will contain only NFET device layers. According to an exemplary embodiment, there are one or more sacrificial layers below electrically insulating layer 611 that were doped with an n-type dopant and there are one or more sacrificial layers above electrically insulating layer 611 that were doped with a p-type dopant. However, in this example, the electrically insulating layer and every layer thereabove has been selectively removed in the pass gate regions of the active area. An anneal is then performed to diffuse/activate the n-type and/or p-type dopant(s) from the sacrificial layers throughout the source/drain regions of the respective pass gate or inverter and/or activate the n-type and/or p-type dopant(s) implanted into the Si layers after dummy gate formation (see above). With regard to the pass gates, the anneal serves to diffuse/activate the n-type dopant(s) from the sacrificial layers (which are present now only in the source and drain regions) throughout the source/drain regions of the pass gate device layers and/or activate the n-type dopant(s) implanted into the Si layers after dummy gate formation (see above). The p-doped sacrificial layers have been removed from the pass gate regions. With regard to the inverters, the anneal serves to diffuse/activate the n-type dopant(s) from the sacrificial layer(s) below electrically insulating layer 611 (present now only in the source and drain regions) throughout the source/drain regions of the inverter NFET device layers and to diffuse/activate the p-type dopant(s) from the sacrificial layer(s) above electrically insulating layer 611 (present now only in the source and drain regions) throughout the source/drain regions of the inverter PFET device layers and/or activate the p-type dopant(s) implanted into the Si layers after dummy gate formation (see above).

Temperatures for this anneal may range from about 960° C. to about 1,100° C., and the anneal may vary in duration from a few milliseconds (ms), for example five ms, to a few seconds, for example, five seconds. The nanowire channels remain undoped which is an important advantage of thin channel, fully depleted devices such as nanowire FETs.

Figure 24:
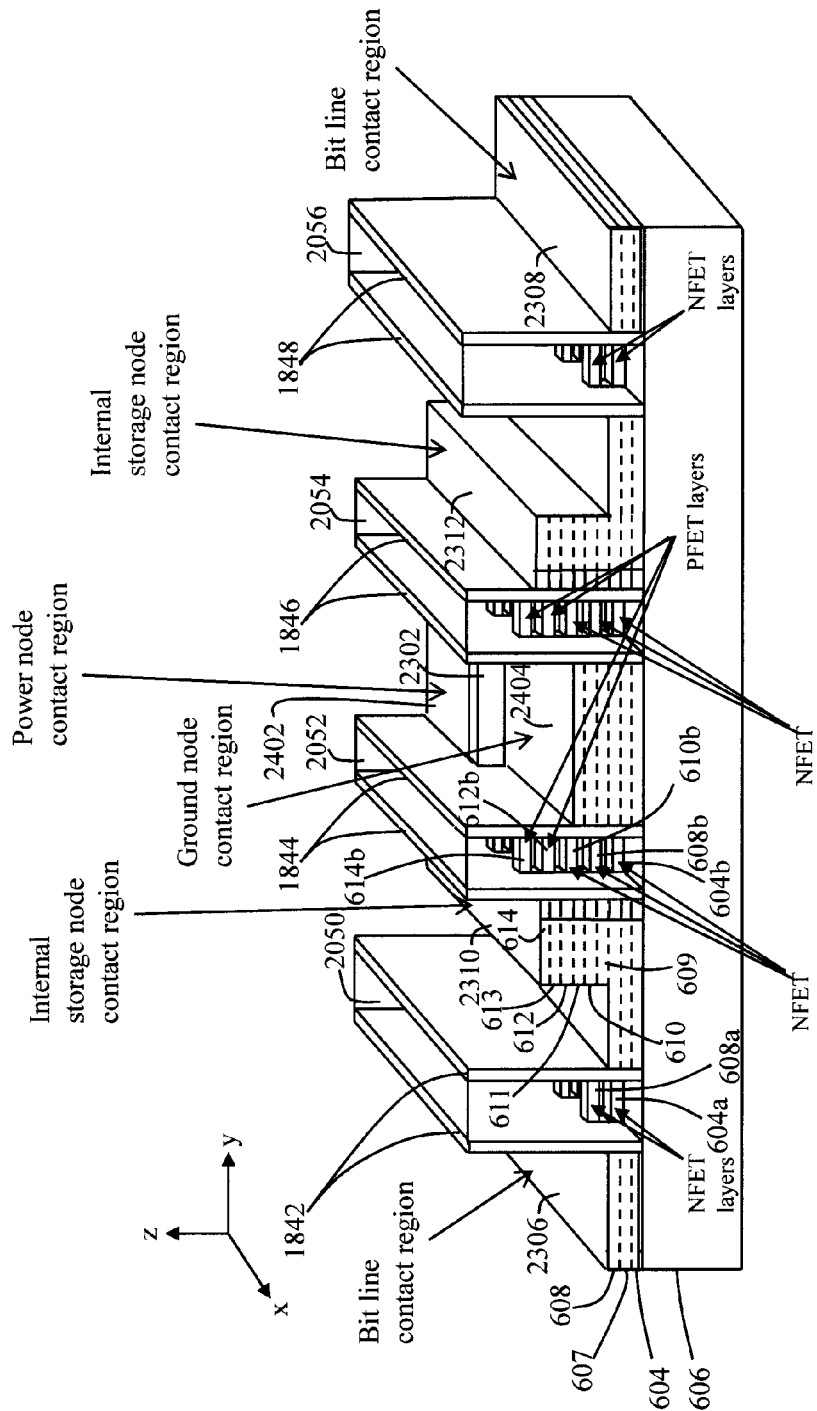
FIG. 24 is a three-dimensional cross-sectional diagram illustrating the formation of power node and ground node contact regions according to an embodiment of the present invention.

An exemplary configuration of these device layers is shown in FIG. 24, with the n-doped device layers labeled "NFET layers" and the p-doped device layer labeled "PFET layer." As will be described in detail below, in each pass gate and inverter the device layers share a common gate. Even though two given device layers might be separated from one another by a gap, or by another layer(s), these two device layers are, for the purposes of the description of the device layer stack, considered to be adjacent device layers. By way of example only, the three NFET device layers of the second inverter shown in FIG. 24 are considered adjacent layers to one another, even though they may be separated by a sacrificial layer in the source and drain regions.

According to an exemplary embodiment, differential chemical oxidation is used to preferentially oxidize the regions of sacrificial material in the source/drain regions which are not covered by a spacer. These regions of sacrificial material can be oxidized preferentially to the exposed Si nanowire channel regions. A wet chemical clean is generally performed at this point to remove surface contamination and native oxide. This is known as the gate stack preclean. A gate dielectric, e.g., $SiO_2$ or a high-K gate dielectric such as hafnium oxide ($HfO_2$), is then formed on the nanowire channels. This is the gate dielectric.

While FIG. 19C shows a cross-section through the spacers and a portion of the stack in which nanowires will be formed (i.e., through plane Y1), FIG. 19D on the other hand is a two-dimensional cross-sectional diagram through plane Y2 (see FIG. 5), i.e., through a portion of the stack in which no nanowires will be formed. The nanowire channels are not present in this depiction.

FIGS. 20A-D are two-dimensional cross-sectional diagrams through planes X1, X2, Y1 and Y2, respectively, (see FIG. 5) illustrating replacement gates 2050, 2052, 2054 and 2056 formed in trenches 1546, 1548, 1550 and 1552, respectively, surrounding the nanowire channels in the trenches by filling the trenches with a gate material. Once the gate material is filled into each trench, CMP is used to planarize the gate, preferably at least down to spacers 1842, 1844, 1846 and 1848 to avoid a "T-shaped" gate with the filler layers acting as an etch stop. Suitable gate materials include, but are not limited to, one or more of polysilicon, a deposited metal(s) and a hybrid stack of multiple materials such as metal polysilicon. Gates 2050, 2052, 2054 and 2056 may all comprise the same gate material. Alternatively, depending on the particular application, the gate material may vary from one pass gate and/or inverter to another. For example, the pass gates may both comprise one gate material, while the inverters comprise a different gate material.

Figure 20D:
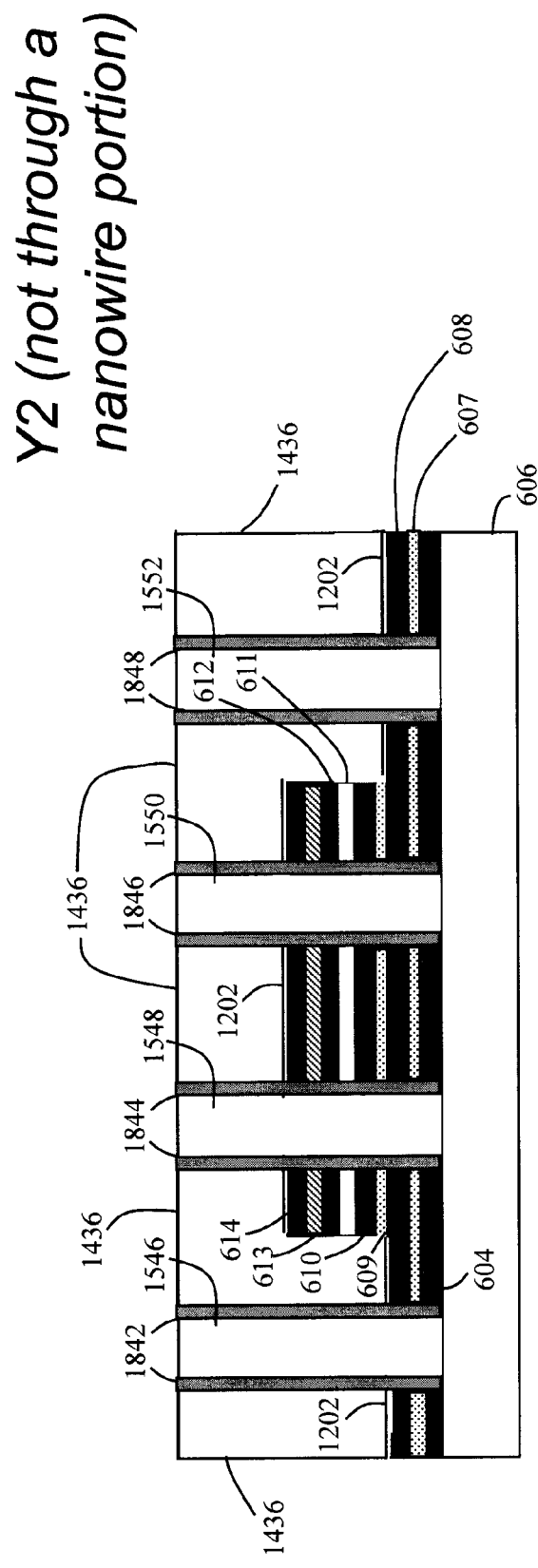

While FIG. 20C shows a cross-section through the spacers and a portion of the stack in which nanowires will be formed (i.e., through plane Y1), FIG. 20D on the other hand is a two-dimensional cross-sectional diagram through plane Y2 (see FIG. 5), i.e., through a portion of the stack in which no nanowires will be formed. The nanowire channels are not present in this depiction.

FIGS. 21A-D are two-dimensional cross-sectional diagrams through planes X1, X2, Y1 and Y2, respectively, (see FIG. 5) illustrating the filler layer 1436 having been removed. According to an exemplary embodiment, the filler layer comprises SiO$_2$ and is removed using an oxide-selective etching process, such as an oxide-selective RIE. Oxide layer 1202 is also removed by this etching process. The oxide layer is removed to permit contact formation in the source and drain regions of the various device layers, see below.

Figure 21A:
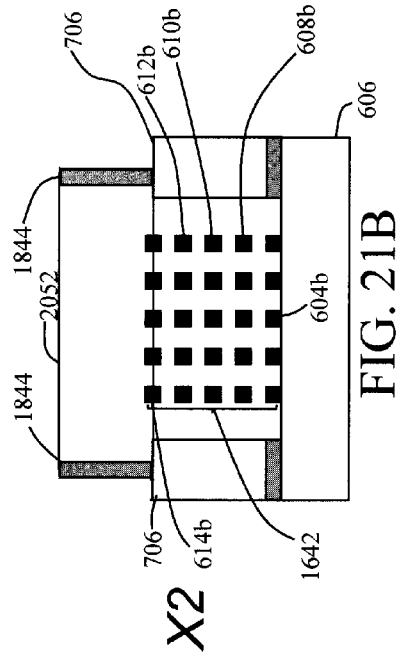
FIGS. 21A-D are two-dimensional cross-sectional diagrams illustrating the filler layer having been removed according to an embodiment of the present invention.
Figure 21B:
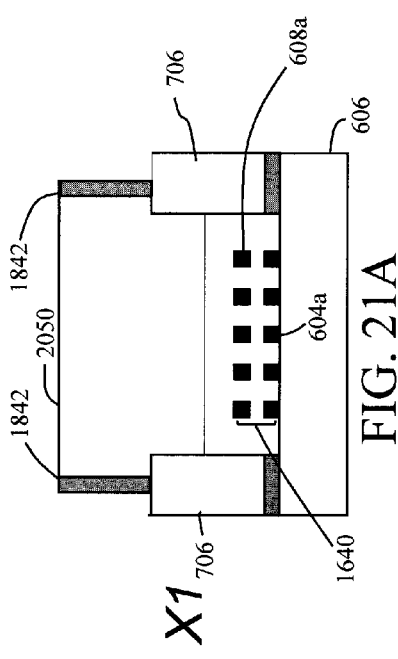
Figure 21C:
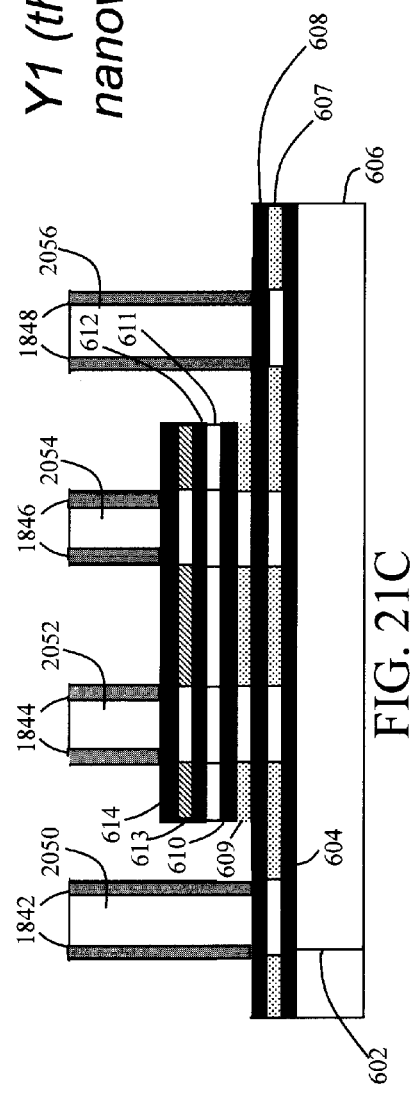
Figure 21D:
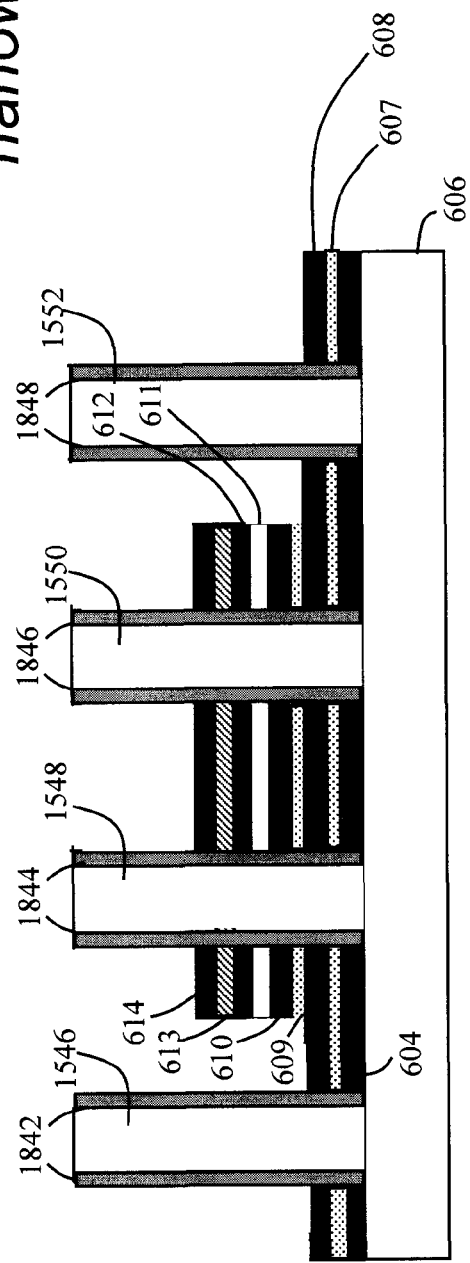

While FIG. 21C shows a cross-section through the spacers and a portion of the stack in which nanowires will be formed (i.e., through plane Y1), FIG. 21D on the other hand is a two-dimensional cross-sectional diagram through plane Y2 (see FIG. 5), i.e., through a portion of the stack in which no nanowires will be formed. The nanowire channels are not present in this depiction.

Figure 22:
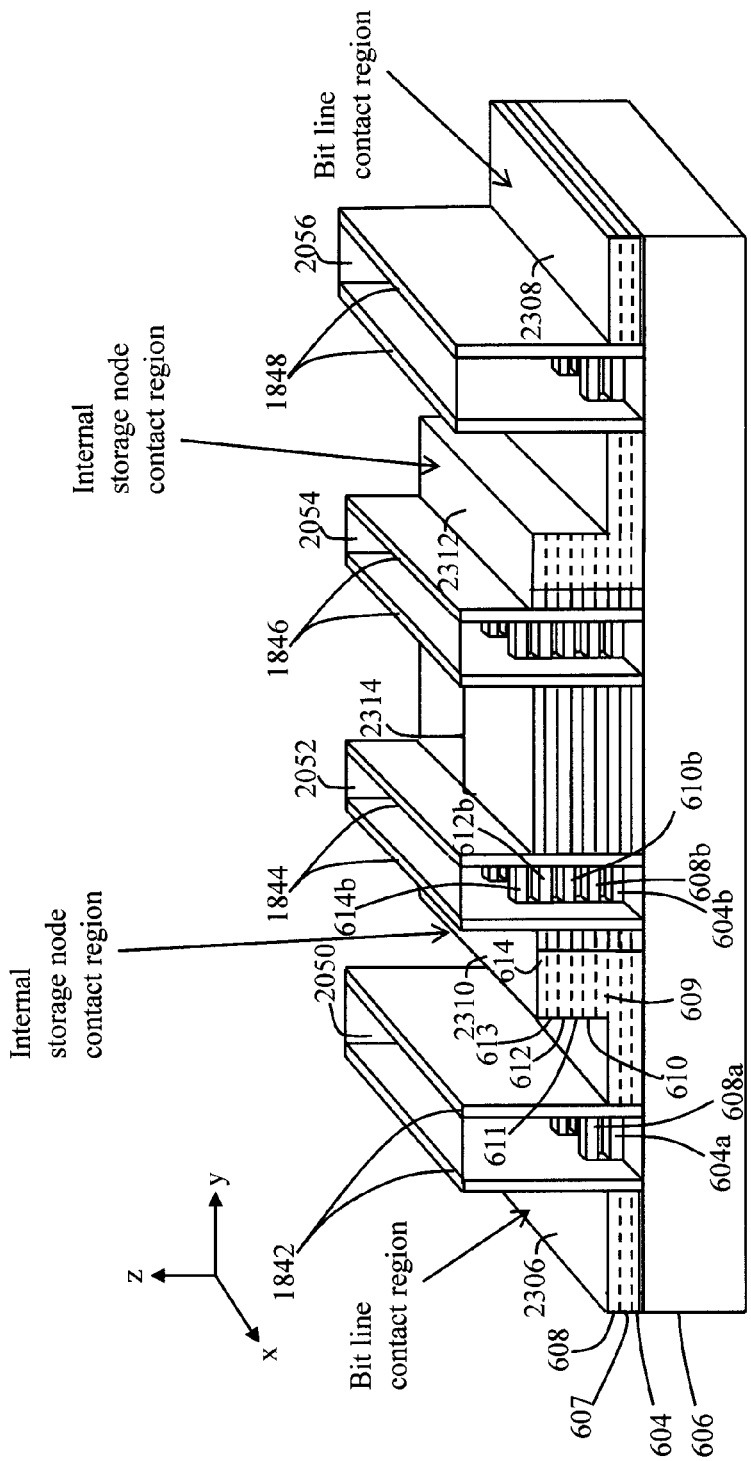
FIG. 22 is a three-dimensional cross-sectional diagram illustrating contacts formed in the bit line contact regions and in the internal storage node contact regions according to an embodiment of the present invention.

Switching now to three-dimensional views to better illustrate the remainder of the process, FIG. 22 is a three-dimensional cross-sectional diagram illustrating contacts 2306 and 2308 formed in the bit line contact regions and contacts 2310 and 2312 formed in the internal storage node contact regions. See description of FIG. 1, above. No contacts have yet been formed in the source regions of the NFET and PFET inverter device layers in the power and ground node contact region 2314. Basically, FIG. 22 illustrates silicidation of all regions except for the power and ground contact regions. According to an exemplary embodiment, contacts 2306, 2308, 2310 and 2312 are formed by using a silicide process using standard methods well known to those of skill in the art. For example, a layer comprising a metal such as nickel (Ni) is blanket deposited to a thickness of from about five nm to about 30 nm, e.g., about 15 nm. The wafer is then annealed at a temperature of from about 350° C. to about 500° C., e.g., 450° C., for a duration of a few milliseconds to a few seconds, e.g., five seconds, so that exposed Si reacts with the Ni to form a nickel silicide. A metal etchant selective to silicide, such as aqua regia (containing nitric and hydrochloric acid), is then used to remove unreacted Ni. The thickness of the remaining silicide is determined by the thickness of the metal layer deposited and the length and temperature of the anneal. The thickness of the silicide is selected so that it bridges across the insulating layer 611. This allows all of the various device layers in contacts 2310 and 2312 to be shorted together, across the thickness of the insulating layer 611. The formation of silicide in power and ground node contact region 2314 may be prevented by using a softmask or hardmask (not shown) to block off that region during silicidation. For illustrative purposes, dotted lines are used for the device layers in these contact regions to depict individual layers merged into a common contact.

Figure 23:
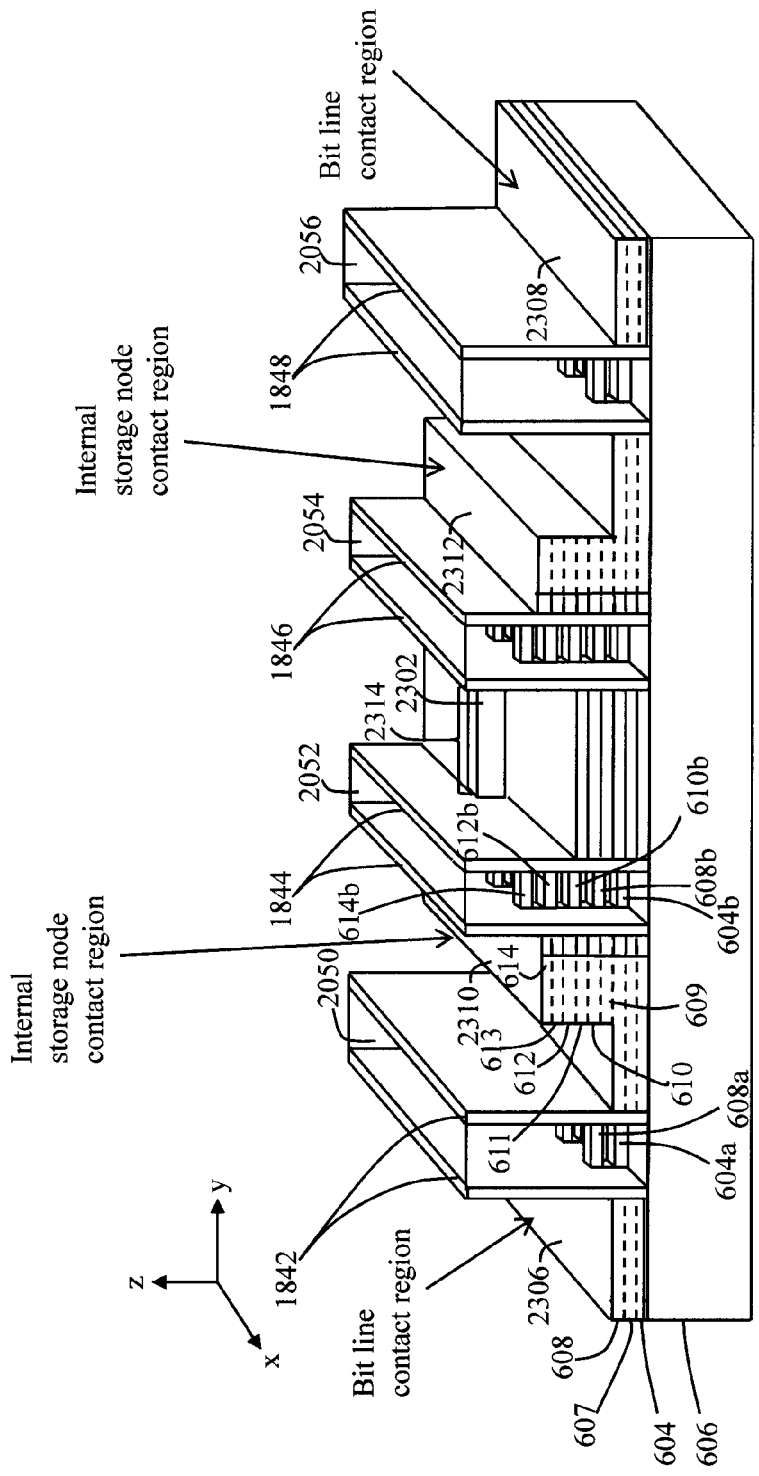
FIG. 23 is a three-dimensional cross-sectional diagram illustrating inverter source region isolation according to an embodiment of the present invention.

FIG. 23 is a three-dimensional cross-sectional diagram illustrating inverter source region isolation. Specifically, as a precursor to the power and ground node contact region contact formation, the NFET and PFET device layers on the source side of the inverters have to be isolated from one another to provide contact to ground and V$_{dd}$ respectively. Basically, FIG. 23 illustrates the exposed ground contact region and the use of a spacer to isolate the power and ground contact regions. According to an exemplary embodiment, this isolation is achieved by first removing a portion, e.g., one half, of Si layers 614 and 612 and sacrificial layer 613 in the common power and ground node contact region 2314. To do so, a hardmask or softmask (not shown) can be blanket deposited and patterned with a location and footprint of the portion of Si layers 614 and 612 and sacrificial layer 613 to be removed. An etch is performed through the patterned mask and the mask is then removed.

A spacer 2302 is then used to isolate the patterned and unpatterned regions. Spacer 2302 can comprise a nitride material. Spacer formation techniques were described, for example, in conjunction with the description of FIG. 18A-D, above.

FIG. 24 is a three-dimensional cross-sectional diagram illustrating power node contact 2402 and ground node contact 2404 formation. Namely, after the patterned and unpatterned regions are isolated from each other by spacer 2302, another silicidation step may be used to form power node contact 2402 and ground node 2404, as illustrated in FIG. 24.

FIGS. 25A-D are top-down schematic diagrams illustrating the benefits of using regular active area shapes (i.e., no corners, only straight lines). Specifically, in FIG. 25A, through use of the present techniques a gridded layout is employed. The result is a gridded design active area and gate design resembling the layout shown, for example, in FIG. 4, described above. In FIG. 25B, the use of conventional processes results in a non-regular active area layout. The use of a non-regular active area, e.g., one that has corners, can result in misalignment problems such as those illustrated in FIGS. 25C and 25D. Namely, FIG. 25C illustrates width variations and FIG. 25D illustrates length variations due to misalignment between the active area and the gate pattern. As shown in FIGS. 25A-D, in the non-regular layout, misalignment between the active area and the gate patterns result in width and length variation of the resulting devices, whereas in the gridded layout, misalignment will affect all devices equally, and will not cause width variation.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for fabricating a SRAM cell, comprising the steps of:
    forming at least one pair of pass gates by forming, for each pass gate, one or more device layers on a wafer, each pass gate device layer including a source region, a drain region and a plurality of nanowire channels connecting the source region and the drain region, and forming a gate common to each of the pass gate device layers surrounding the nanowire channels, wherein the nanowire channels are formed by forming an alternating series of silicon and sacrificial layers in a stack on the wafer, wherein one or more of the sacrificial layers comprise at least one n-type dopant and one or more other of the sacrificial layers comprise at least one p-type dopant;
    forming nanowire hardmasks over the silicon and sacrificial layers in regions of the cell in which the pass gates and at least one pair of inverters are to be formed, wherein the nanowire hardmasks comprise a dual hardmask structure having an oxide portion and a nitride portion over the oxide portion;
    forming the at least one pair of inverters by forming, for each inverter, a plurality of device layers adjacent to the pass gate device layers on the wafer, each inverter device layer including a source region, a drain region and a plurality of nanowire channels connecting the source region and the drain region, and forming a gate common to each of the inverter device layers surrounding the nanowire channels;
    introducing at least one n-type dopant into the source and drain regions of one or more of the pass gate device layers;

introducing at least one n-type dopant into the source and drain regions of one or more of the inverter device layers; and introducing at least one p-type dopant into the source and drain regions of one or more other of the inverter device layers.

2. The method of claim 1, wherein the SRAM cell comprises one pair of pass gates and one pair of inverters formed on the wafer, the method further comprising the step of:

performing the steps of forming the pair of pass gates and forming the pair of inverters such that the pair of inverters are located in between the pair of pass gates.

3. The method of claim 1, further comprising the step of:

forming an electrically insulating layer separating the one or more sacrificial layers comprising the at least one n-type dopant from the one or more other of the sacrificial layers comprising the at least one p-type dopant, such that the one or more sacrificial layers comprising the at least one n-type dopant are below the electrically insulating layer and the one or more other of the sacrificial layers comprising the at least one p-type dopant are above the electrically insulating layer.

4. The method of claim 3, further comprising the step of:

selectively removing portions of the electrically insulating layer and portions of the silicon layers and sacrificial layers comprising the at least one p-type dopant above the electrically insulating layer in regions of the cell in which the pass gates are to be formed.

5. The method of claim 3, further comprising the steps of:

diffusing the n-type dopant from the one or more sacrificial layers below the electrically insulating layer throughout one or more of the silicon layers below the electrically insulating layer; and diffusing the p-type dopant from the one or more sacrificial layers above the electrically insulating layer throughout one or more of the silicon layers above the electrically insulating layer.

* * * * *